US012615884B2

(12) United States Patent
Matsukura et al.

(10) Patent No.: US 12,615,884 B2
(45) Date of Patent: Apr. 28, 2026

(54) NITRIDE SEMICONDUCTOR LIGHT-EMITTING ELEMENT

(71) Applicant: NIKKISO CO., LTD., Tokyo (JP)

(72) Inventors: Yusuke Matsukura, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 371 days.

(21) Appl. No.: 18/311,343

(22) Filed: May 3, 2023

(65) Prior Publication Data

US 2023/0378393 A1      Nov. 23, 2023

(30) Foreign Application Priority Data

May 20, 2022    (JP) ................................. 2022-082767

(51) Int. Cl.
| | |
|---|---|
| *H10H 20/81* | (2025.01) |
| *H10H 20/812* | (2025.01) |
| *H10H 20/825* | (2025.01) |

(52) U.S. Cl.
CPC ...... *H10H 20/8215* (2025.01); *H10H 20/812* (2025.01); *H10H 20/825* (2025.01)

(58) Field of Classification Search
CPC .......................... H10H 20/825; H10H 20/8215
See application file for complete search history.

(56) References Cited

U.S. PATENT DOCUMENTS

| | | | |
|---|---|---|---|
| 8,278,129 B2 | 10/2012 | Takano et al. | |
| 9,112,115 B2 | 8/2015 | Inazu et al. | |
| 9,356,192 B2 | 5/2016 | Pernot et al. | |
| 9,502,606 B2 | 11/2016 | Pernot et al. | |

(Continued)

FOREIGN PATENT DOCUMENTS

| | | |
|---|---|---|
| CN | 103003961 A | 3/2013 |
| CN | 109075160 A | 12/2018 |

(Continued)

OTHER PUBLICATIONS

Notice of Reasons for Refusal dated Aug. 6, 2024 received from the Japanese Patent Office in counterpart JP 2023-131100, together with English language translation.

(Continued)

*Primary Examiner* — Douglas M Menz
(74) *Attorney, Agent, or Firm* — Scully, Scott, Murphy & Presser, PC

(57) ABSTRACT

A nitride semiconductor light-emitting element emits ultraviolet light at a central wavelength of more than 320 nm and not more than 365 nm. The nitride semiconductor light-emitting element includes a substrate having a c-plane as a growth surface and a nitride semiconductor layer stacked on the growth surface of the substrate. The nitride semiconductor layer includes an n-type semiconductor layer, and an active layer being formed on the n-type semiconductor layer on the opposite side to the substrate and comprising a single quantum well structure with one well layer. The n-type semiconductor layer has an Al composition ratio of not more than 50% and a film thickness of more than 2 µm. A composition difference obtained by subtracting an Al composition ratio of the well layer from the Al composition ratio of the n-type semiconductor layer is not less than 22%.

4 Claims, 14 Drawing Sheets

(56) References Cited

U.S. PATENT DOCUMENTS

| | | | |
|---|---|---|---|
| 10,453,990 B2 | 10/2019 | Furusawa | |
| 11,476,391 B2 | 10/2022 | Matsukura et al. | |
| 11,984,535 B2 | 5/2024 | Watanabe | |
| 2004/0206949 A1 | 10/2004 | Bour et al. | |
| 2004/0206969 A1 | 10/2004 | Bour et al. | |
| 2007/0126009 A1 | 6/2007 | Sakai et al. | |
| 2010/0270583 A1 | 10/2010 | Takano et al. | |
| 2014/0021442 A1 | 1/2014 | Inazu et al. | |
| 2014/0158983 A1 | 6/2014 | Pernot et al. | |
| 2016/0211411 A1 | 7/2016 | Liao et al. | |
| 2016/0240727 A1 | 8/2016 | Pernot et al. | |
| 2017/0317235 A1 | 11/2017 | Iguchi et al. | |
| 2018/0277714 A1 | 9/2018 | Furusawa | |
| 2020/0279973 A1* | 9/2020 | Furusawa | H10H 20/0133 |
| 2020/0388725 A1 | 12/2020 | Matsukura et al. | |
| 2021/0391502 A1 | 12/2021 | Watanabe | |
| 2023/0197889 A1 | 6/2023 | Hirano et al. | |
| 2023/0261139 A1 | 8/2023 | Hirano et al. | |

FOREIGN PATENT DOCUMENTS

| | | | |
|---|---|---|---|
| JP | 2010-258097 A | 11/2010 | |
| JP | 2013-187296 A | 9/2013 | |
| JP | 2018-163941 A | 10/2018 | |
| JP | 2020-077874 A | 5/2020 | |
| JP | 2020-202214 A | 12/2020 | |
| TW | 202032811 A | 9/2020 | |
| WO | 2012-144046 A1 | 10/2012 | |
| WO | 2013/021464 A | 2/2013 | |
| WO | 2016072150 A1 | 5/2016 | |
| WO | 2021/260850 A1 | 12/2021 | |
| WO | 2022-038769 A1 | 2/2022 | |

OTHER PUBLICATIONS

Notice of Reasons for Refusal dated Aug. 6, 2024 received from the Japanese Patent Office in counterpart JP2023-131101, together with English language translation.

Japanese Office Action dated Jun. 13, 2023 from related application JP 2022-082767 together with English language translation.

Office Action dated Feb. 26, 2024 received from the Taiwanese Patent Office in related TW 112118283 together with English language translation.

Taiwanese Official Action dated Aug. 6, 2024 from counterpart TW 112118283 together with an English language translation.

Taiwanese Official Action dated Nov. 7, 2024 from counterpart TW 113119077 together with an English language translation.

Taiwanese Official Action dated Nov. 8, 2024 from counterpart TW 112118283 together with an English language translation.

Notice of Reasons for Refusal dated May 7, 2024 received from the Japanese Patent Office in counterpart JP 2023-131100, together with English language translation.

Notice of Reasons for Refusal dated May 7, 2024 received from the Japanese Patent Office in counterpart JP2023-131101, together with English language translation.

Taiwanese Official Action dated Oct. 23, 2024 from counterpart TW 112118283 together with an English language translation.

* cited by examiner

*FIG. 8*

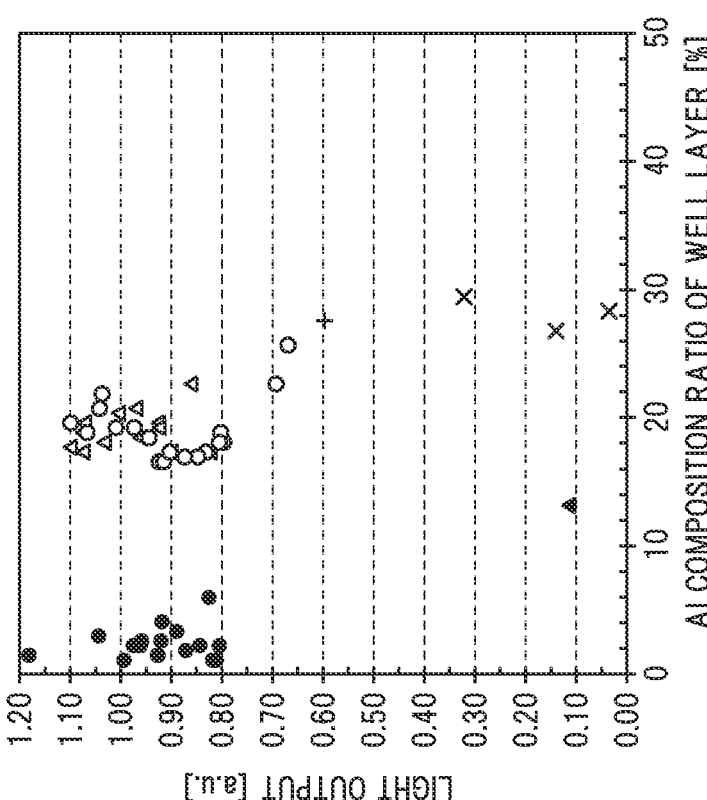

× SQW LATTICE RELAXATION (EMISSION WAVELENGTH: LESS THAN 300 nm)

○ SQW LATTICE RELAXATION (EMISSION WAVELENGTH: NOT LESS THAN 300 nm AND NOT MORE THAN 320 nm)

● SQW LATTICE RELAXATION (EMISSION WAVELENGTH: MORE THAN 320 nm AND NOT MORE THAN 365 nm)

+ SQW COHERENT (EMISSION WAVELENGTH: LESS THAN 300 nm)

△ SQW COHERENT (EMISSION WAVELENGTH: NOT LESS THAN 300 nm AND NOT MORE THAN 320 nm)

▲ SQW COHERENT (EMISSION WAVELENGTH: MORE THAN 320 nm AND NOT MORE THAN 365 nm)

*FIG. 9*

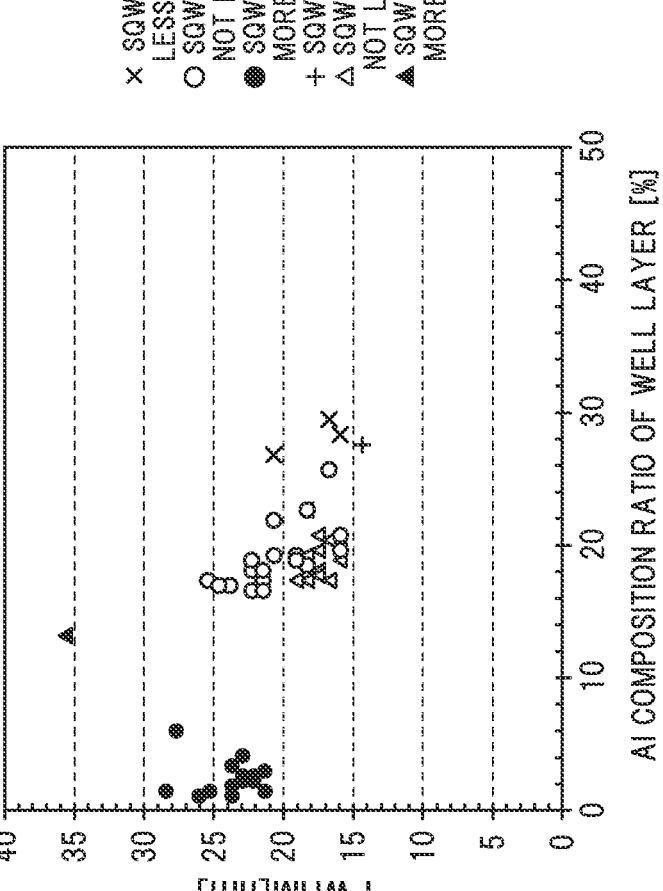

× SQW LATTICE RELAXATION (EMISSION WAVELENGTH: LESS THAN 300 nm)

○ SQW LATTICE RELAXATION (EMISSION WAVELENGTH: NOT LESS THAN 300 nm AND NOT MORE THAN 320 nm)

● SQW LATTICE RELAXATION (EMISSION WAVELENGTH: MORE THAN 320 nm AND NOT MORE THAN 365 nm)

+ SQW COHERENT (EMISSION WAVELENGTH: LESS THAN 300 nm)

△ SQW COHERENT (EMISSION WAVELENGTH: NOT LESS THAN 300 nm AND NOT MORE THAN 320 nm)

▲ SQW COHERENT (EMISSION WAVELENGTH: MORE THAN 320 nm AND NOT MORE THAN 365 nm)

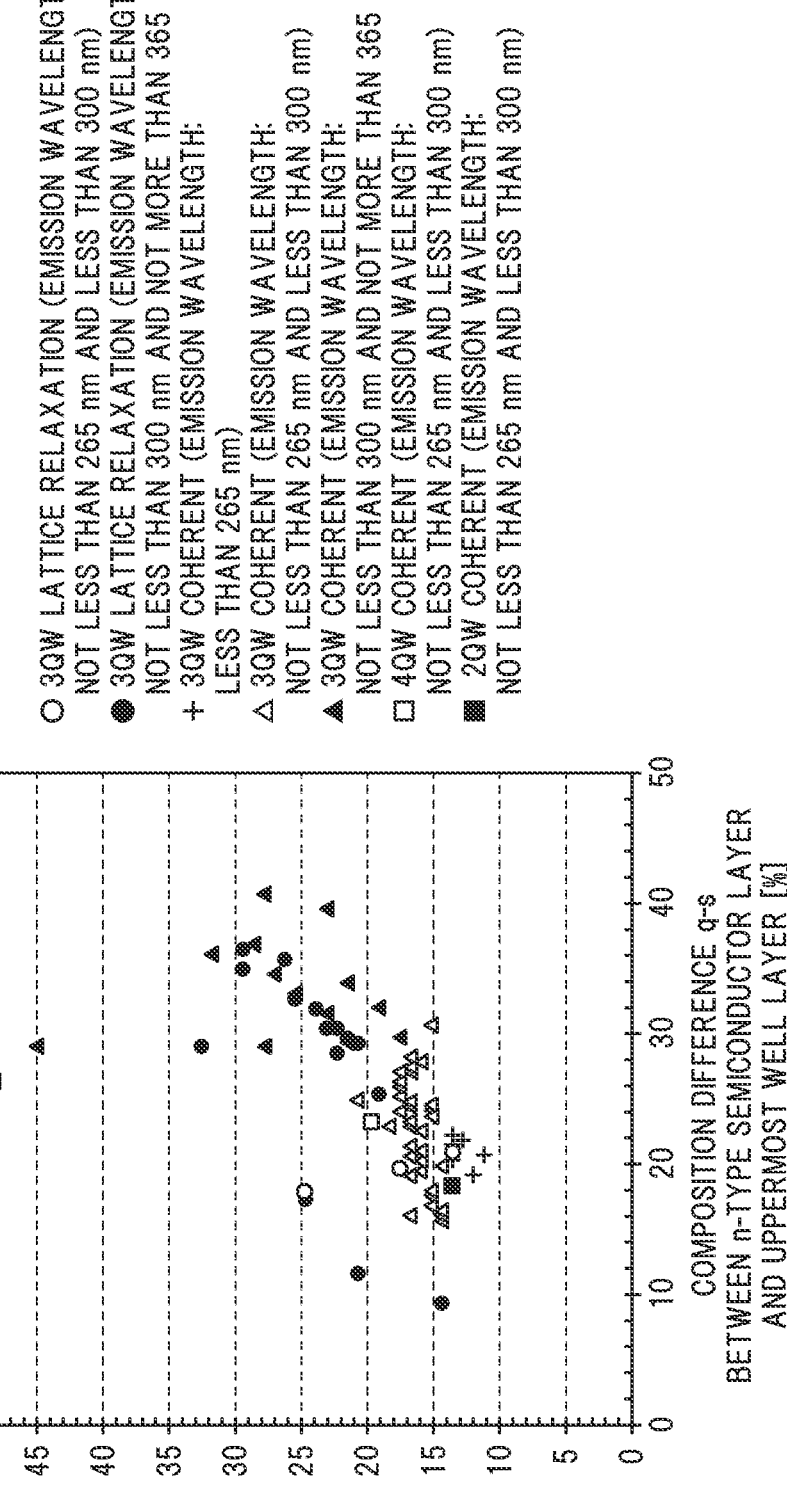

FIG. 13

○ 3QW LATTICE RELAXATION (EMISSION WAVELENGTH: NOT LESS THAN 265 nm AND LESS THAN 300 nm)
● 3QW LATTICE RELAXATION (EMISSION WAVELENGTH: NOT LESS THAN 300 nm AND NOT MORE THAN 365 nm)
+ 3QW COHERENT (EMISSION WAVELENGTH: LESS THAN 265 nm)
△ 3QW COHERENT (EMISSION WAVELENGTH: NOT LESS THAN 265 nm AND LESS THAN 300 nm)
▲ 3QW COHERENT (EMISSION WAVELENGTH: NOT LESS THAN 300 nm AND NOT MORE THAN 365 nm)
□ 4QW COHERENT (EMISSION WAVELENGTH: NOT LESS THAN 265 nm AND LESS THAN 300 nm)
■ 2QW COHERENT (EMISSION WAVELENGTH: NOT LESS THAN 265 nm AND LESS THAN 300 nm)

*FIG. 14*

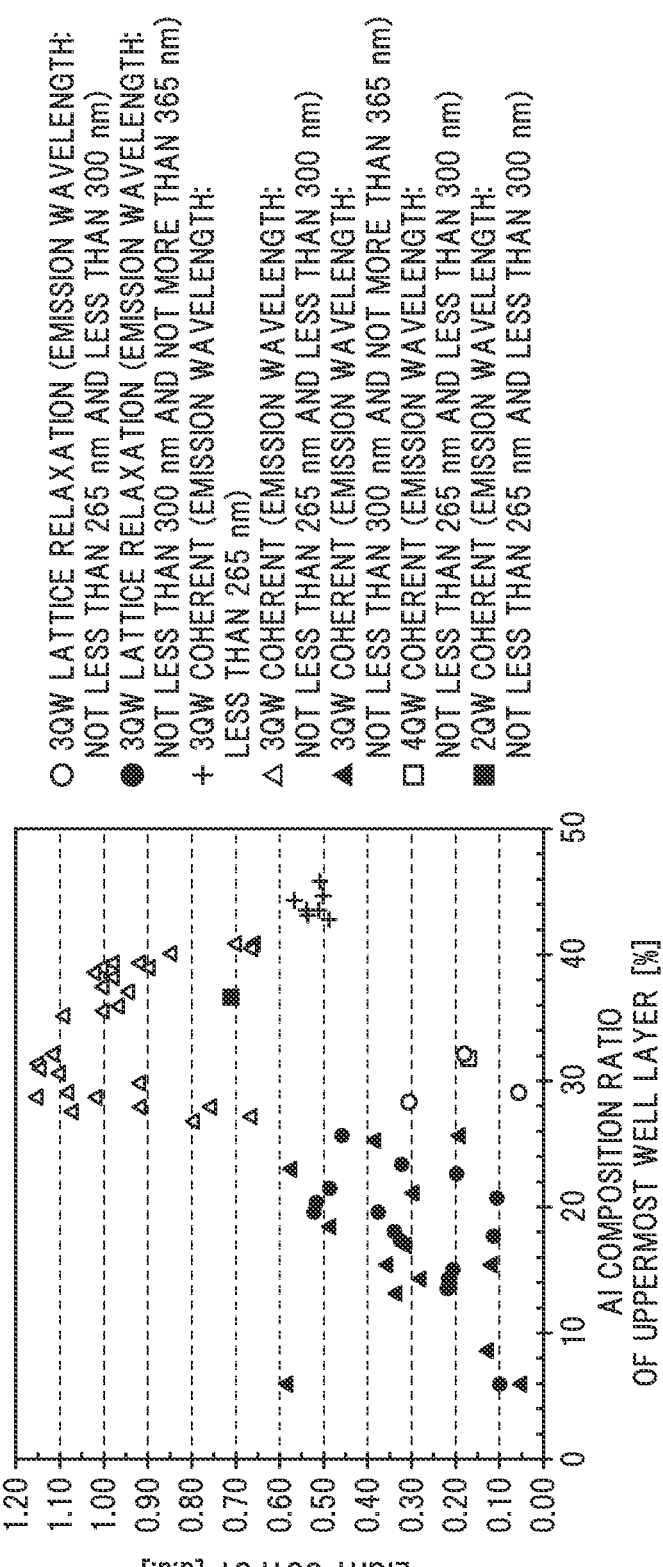

○ 3QW LATTICE RELAXATION (EMISSION WAVELENGTH: NOT LESS THAN 265 nm AND LESS THAN 300 nm)

● 3QW LATTICE RELAXATION (EMISSION WAVELENGTH: NOT LESS THAN 300 nm AND NOT MORE THAN 365 nm)

+ 3QW COHERENT (EMISSION WAVELENGTH: LESS THAN 265 nm)

△ 3QW COHERENT (EMISSION WAVELENGTH: NOT LESS THAN 265 nm AND LESS THAN 300 nm)

▲ 3QW COHERENT (EMISSION WAVELENGTH: NOT LESS THAN 300 nm AND NOT MORE THAN 365 nm)

□ 4QW COHERENT (EMISSION WAVELENGTH: NOT LESS THAN 265 nm AND LESS THAN 300 nm)

■ 2QW COHERENT (EMISSION WAVELENGTH: NOT LESS THAN 265 nm AND LESS THAN 300 nm)

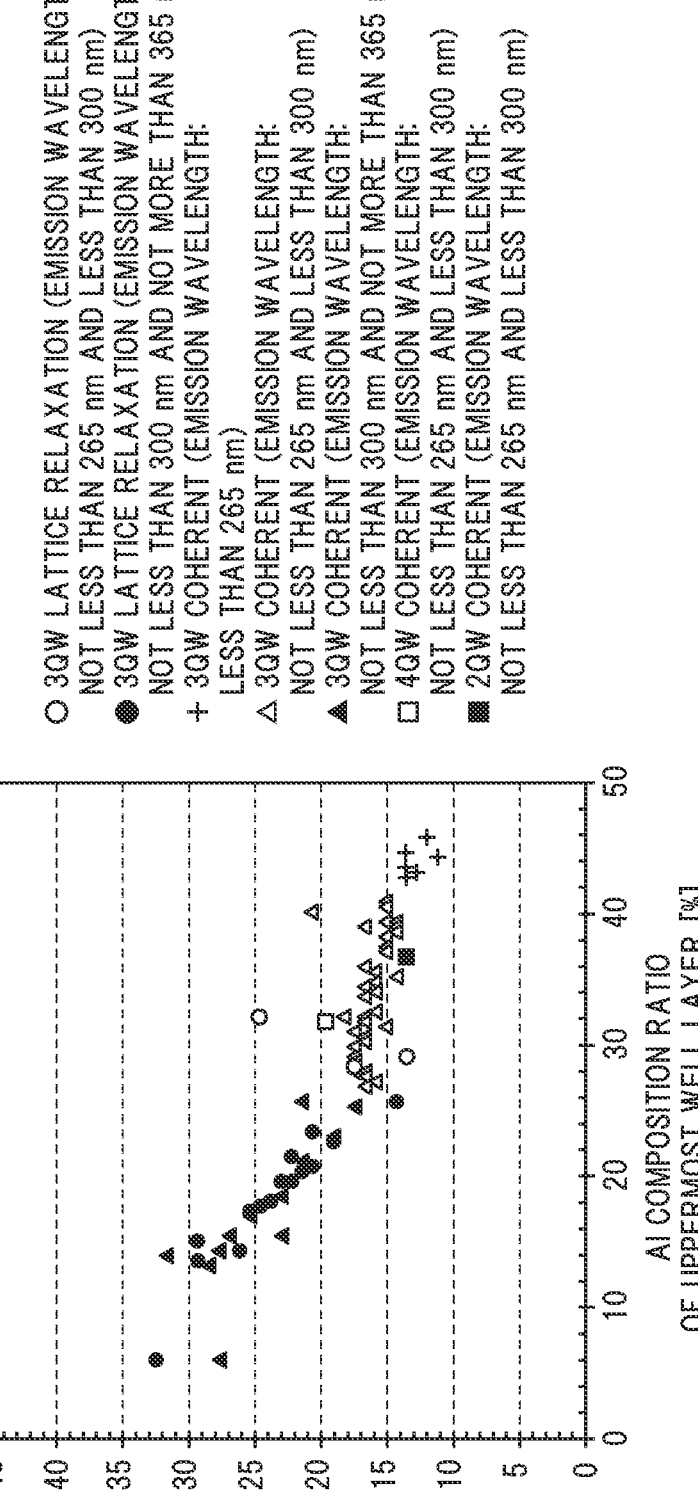

FIG. 15

○ 3QW LATTICE RELAXATION (EMISSION WAVELENGTH: NOT LESS THAN 265 nm AND LESS THAN 300 nm)

● 3QW LATTICE RELAXATION (EMISSION WAVELENGTH: NOT LESS THAN 300 nm AND NOT MORE THAN 365 nm)

+ 3QW COHERENT (EMISSION WAVELENGTH: LESS THAN 265 nm)

△ 3QW COHERENT (EMISSION WAVELENGTH: NOT LESS THAN 265 nm AND LESS THAN 300 nm)

▲ 3QW COHERENT (EMISSION WAVELENGTH: NOT LESS THAN 300 nm AND NOT MORE THAN 365 nm)

□ 4QW COHERENT (EMISSION WAVELENGTH: NOT LESS THAN 265 nm AND LESS THAN 300 nm)

■ 2QW COHERENT (EMISSION WAVELENGTH: NOT LESS THAN 265 nm AND LESS THAN 300 nm)

NITRIDE SEMICONDUCTOR LIGHT-EMITTING ELEMENT

CROSS-REFERENCE TO RELATED APPLICATIONS

The present application is based on Japanese patent application No. 2022-082767 filed on May 20, 2022, the entire contents of which are incorporated herein by reference.

TECHNICAL FIELD

The present invention relates to a nitride semiconductor light-emitting element.

BACKGROUND OF THE INVENTION

Patent Literature 1 discloses a nitride semiconductor light-emitting element in which plural layers made of nitride semiconductors are stacked on a substrate.
Citation List Patent Literature 1: WO2016/072150

SUMMARY OF THE INVENTION

To improve light output of nitride semiconductor light-emitting elements, the configuration to be adopted should be changed for each emission wavelength. However, this is not considered in the nitride semiconductor light-emitting element described in Patent Literature 1, and there is room for improvement.

The invention was made in view of such circumstances and it is an object of the invention to provide a nitride semiconductor light-emitting element that can achieve improved light output in a specific range of emission wavelength.

To achieve the object described above, the invention provides a nitride semiconductor light-emitting element that emits ultraviolet light at a central wavelength of more than 320 nm and not more than 365 nm, the nitride semiconductor light-emitting element comprising:

a substrate having a c-plane as a growth surface; and
a nitride semiconductor layer stacked on the growth surface of the substrate,
wherein the nitride semiconductor layer comprises an n-type semiconductor layer comprising Al, Ga and N, an active layer being formed on the n-type semiconductor layer on the opposite side to the substrate and comprising a single quantum well structure with one well layer comprising Al, Ga and N, and a p-type semiconductor layer formed on the active layer on the opposite side to the substrate,
wherein the n-type semiconductor layer has an Al composition ratio of not more than 50% and a film thickness of more than 2 μm, and
wherein a composition difference obtained by subtracting an Al composition ratio of the well layer from the Al composition ratio of the n-type semiconductor layer is not less than 22%.

To achieve the object described above, the invention also provides a nitride semiconductor light-emitting element that emits ultraviolet light at a central wavelength of not less than 300 nm and not more than 320 nm, the nitride semiconductor light-emitting element comprising:

a substrate having a c-plane as a growth surface; and
a nitride semiconductor layer stacked on the growth surface of the substrate, wherein the nitride semiconductor layer comprises an n-type semiconductor layer comprising Al, Ga and N, an active layer being formed on the n-type semiconductor layer on the opposite side to the substrate and comprising a single quantum well structure with one well layer comprising Al, Ga and N, and a p-type semiconductor layer formed on the active layer on the opposite side to the substrate, and
wherein the active layer comprises a first barrier layer, a second barrier layer and the well layer in this order from the n-type semiconductor layer side, the first barrier layer comprising Al and N, and the second barrier layer comprising Al, Ga, and N and having an Al composition ratio lower than that of the first barrier layer.

To achieve the object described above, the invention also provides a nitride semiconductor light-emitting element that emits ultraviolet light at a central wavelength of not less than 265 nm and less than 300 nm, the nitride semiconductor light-emitting element comprising:

a substrate having a c-plane as a growth surface; and
a nitride semiconductor layer stacked on the growth surface of the substrate,
wherein the nitride semiconductor layer comprises an n-type semiconductor layer comprising Al, Ga and N, an active layer being formed on the n-type semiconductor layer on the opposite side to the substrate and comprising a multi quantum well structure with a plurality of well layers comprising Al, Ga and N, and a p-type semiconductor layer formed on the active layer on the opposite side to the substrate, and
wherein an Al composition ratio of the n-type semiconductor layer is more than 50% and not more than 70%.

Advantageous Effects of the Invention

According to the invention, it is possible to provide a nitride semiconductor light-emitting element that can achieve improved light output in a specific range of emission wavelength.

BRIEF DESCRIPTION OF DRAWINGS

FIG. 8 is a graph showing a relationship between Al composition ratio of well layer and light output when the active layer has a single quantum well structure in Experiment Example.

FIG. 9 is a graph showing a relationship between Al composition ratio of well layer and full width at half maximum when the active layer has a single quantum well structure in Experiment Example.

FIG. 13 is a graph showing a relationship between composition difference q-s and full width at half maximum when the active layer has a multi quantum well structure in Experiment Example.

FIG. 14 is a graph showing a relationship between Al composition ratio of uppermost well layer and light output when the active layer has a multi quantum well structure in Experiment Example.

FIG. 15 is a graph showing a relationship between Al composition ratio of uppermost well layer and full width at half maximum when the active layer has a multi quantum well structure in Experiment Example.

DETAILED DESCRIPTION OF THE INVENTION

First Embodiment

The first embodiment of the invention will be described in reference to FIG. 1. The embodiment below is described as a preferred illustrative example for implementing the invention. Although some part of the embodiment specifically illustrates various technically preferable matters, the technical scope of the invention is not limited to such specific aspects.

Nitride Semiconductor Light-Emitting Element 1

Figure 1:
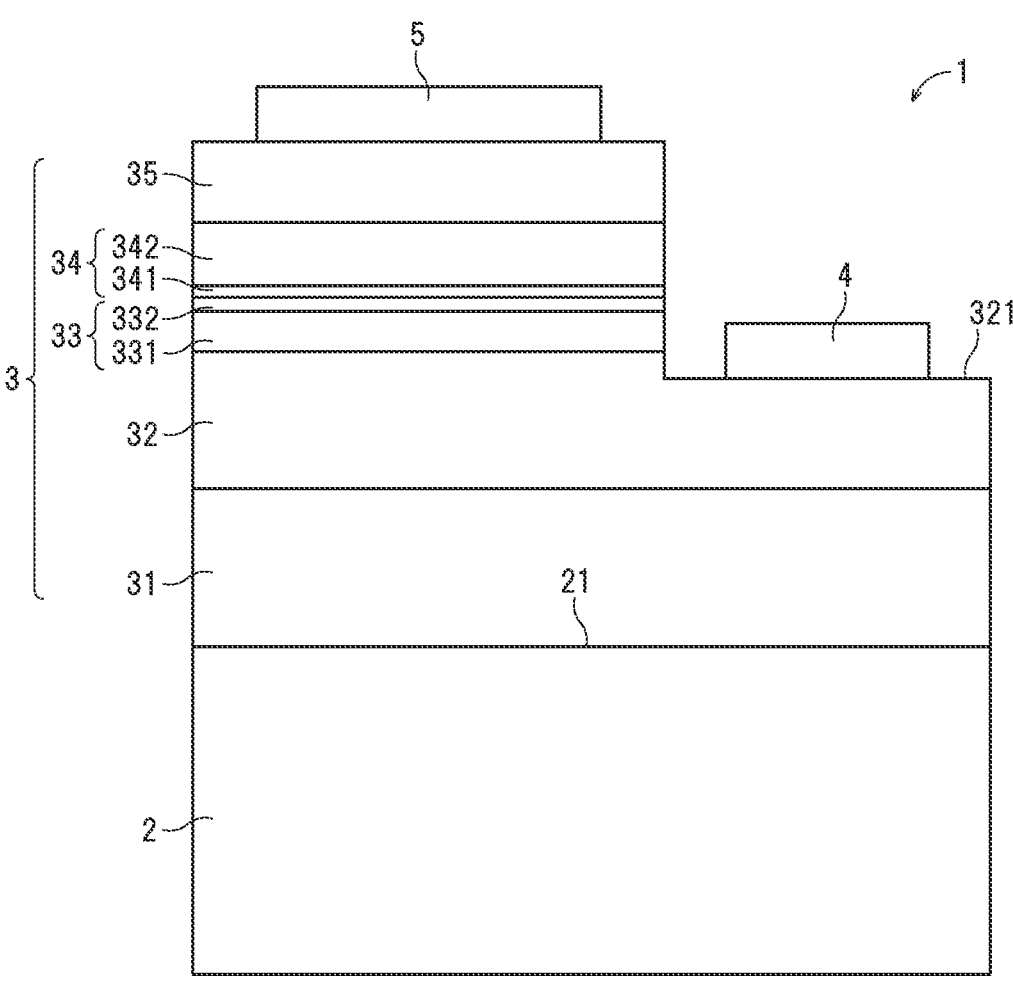
FIG. 1 is a schematic diagram illustrating a configuration of a nitride semiconductor light-emitting element in the first embodiment.

FIG. 1 is a schematic diagram illustrating a configuration of a nitride semiconductor light-emitting element 1 in the first embodiment. In FIG. 1, the scale ratio of each layer of the nitride semiconductor light-emitting element 1 (hereinafter, also simply referred to as "the light-emitting element 1") in a stacking direction is not necessarily the same as the actual scale ratio.

The light-emitting element 1 constitutes, e.g., a light-emitting diode (LED) or a semiconductor laser (LD: laser diode). The light-emitting element 1 in the first embodiment constitutes a light-emitting diode that emits ultraviolet light at a central wavelength of more than 320 nm and not more than 365 nm. The light-emitting element 1 includes a substrate 2, a nitride semiconductor layer 3 formed on a growth surface 21 of the substrate 2, and an n-side electrode 4 and a p-side electrode 5 that are connected to the nitride semiconductor layer 3. Hereinafter, a direction of stacking the substrate 2 and the nitride semiconductor layer 3 is referred to as the up-and-down direction, one side of the substrate 2 where the nitride semiconductor layer 3 is stacked (i.e., an upper side in FIG. 1) is referred to as the upper side, and the opposite side (i.e., a lower side in FIG. 1) is referred to as the lower side. The terms "upper" and "lower" are used for the sake of convenience and do not limit the posture of the light-emitting element 1 with respect to the vertical direction when, e.g., the light-emitting element 1 is in use.

The substrate 2 is made of a material transparent to ultraviolet light emitted by an active layer 33 (described later). In the first embodiment, the substrate 2 is a sapphire ($Al_2O_3$) substrate. The growth surface 21 of the substrate 2, which is a surface on which the nitride semiconductor layer 3 is stacked, is a c-plane. This c-plane may have an off-angle. Alternatively, e.g., an aluminum nitride (AlN) substrate or an aluminum gallium nitride substrate, etc., may be used as the substrate 2.

Each layer of the nitride semiconductor layer 3 is composed of, e.g., a binary to quaternary group III nitride semiconductor expressed by $Al_aGa_bIn_{1-a-b}N$ ($0 \le a \le 1$, $0 \le b \le 1$, $0 < a+b \le 1$). In the first embodiment, each layer of the nitride semiconductor layer 3 is made of a binary or ternary group III nitride semiconductor expressed by $Al_cGa_{1-c}N$ ($0 \le c \le 1$). The group III elements may be partially substituted with boron (B) or thallium (Tl), etc. In addition, nitrogen (N) may be partially substituted with phosphorus (P), arsenic (As), antimony (Sb) or bismuth (Bi), etc. Each layer of the nitride semiconductor layer 3 has a thickness in the up-and-down direction. The nitride semiconductor layer 3 includes a buffer layer 31, an n-type semiconductor layer 32, the active layer 33, an electron blocking layer 34 and a p-type semiconductor layer 35 in this order from the substrate 2 side.

The buffer layer 31 has a layer made of aluminum nitride. The buffer layer 31 may be, e.g., formed of a single layer made of aluminum nitride, or may include a layer made of aluminum gallium nitride in addition to a layer made of aluminum nitride. A film thickness of the buffer layer 31 is, e.g., not less than 1 μm and not more than 4 μm. By setting the film thickness of the buffer layer 31 to not less than 1 μm, formation of dislocations due to the difference in lattice constant between the buffer layer 31 and the substrate 2 up to an upper end of the buffer layer 31 is suppressed, allowing the lattice constant at the upper end portion of the buffer layer 31 to be the original lattice constant of aluminum nitride. By setting the film thickness of the buffer layer 31 to not more than 4 μm, it is possible to suppress occurrence of cracks due to a difference in thermal expansion coefficient between the buffer layer 31 and the layers adjacent to the buffer layer 31. When the substrate 2 is an aluminum nitride substrate or an aluminum gallium nitride substrate, the buffer layer 31 may not be necessarily included.

The n-type semiconductor layer 32 is, e.g., an n-type cladding layer made of $Al_qGa_{1-q}N$ ($0 \le q \le 1$) doped with an n-type impurity. The n-type semiconductor layer 32 has an Al composition ratio q (also called AlN mole fraction) of not more than 50% and has a film thickness of more than 2 μm. This causes lattice relaxation to occur in the n-type semiconductor layer 32. When, as in the first embodiment, the central wavelength of ultraviolet light emitted by the light-emitting element 1 is more than 320 nm and not more than 365 nm and the active layer 33 has a single quantum well (SQW) structure as described later, occurrence of lattice relaxation in the n-type semiconductor layer 32 improves light output of the light-emitting element 1. The reason for this is presumably that when the central wavelength of ultraviolet light emitted by the light-emitting element 1 is more than 320 nm and not more than 365 nm and the active layer 33 has a single quantum well structure, occurrence of lattice relaxation in the n-type semiconductor layer 32 causes strain in the active layer 33 formed on the n-type semiconductor layer 32 to be suitable for light emission. The occurrence of lattice relaxation in the n-type semiconductor layer 32 results in that strain generated in the n-type semiconductor layer 32 becomes smaller than when the n-type semiconductor layer 32 is coherently grown, and strain generated in the active layer 33 formed on the upper side thereof becomes also small.

The film thickness of the n-type semiconductor layer 32 is preferably not less than 2.5 μm. As a result, the n-type semiconductor layer 32 becomes close to a state of complete lattice relaxation, crystallinity of the active layer 33 formed on the n-type semiconductor layer 32 is improved, and light output is improved. The film thickness of the n-type semiconductor layer 32 is also preferably not more than 4 μm. As a result, a wasteful increase in film formation time of the n-type semiconductor layer 32 is suppressed and productivity of the light-emitting element 1 is improved.

In the first embodiment, the n-type semiconductor layer 32 is composed of a single n-type cladding layer. However, the n-type semiconductor layer 32 may be composed of plural layers. In this case, the Al composition ratio of the n-type semiconductor layer 32 means an Al composition ratio of each layer of the n-type semiconductor layer 32, and the film thickness of the n-type semiconductor layer 32 means a film thickness of the entire n-type semiconductor layer 32, i.e., the total film thickness of the layers of the n-type semiconductor layer 32, unless otherwise specified.

In the first embodiment, silicon (Si) is used as an n-type impurity to dope the n-type semiconductor layer 32. The same applies to the semiconductor layers containing an n-type impurity other than the n-type semiconductor layer 32. Alternatively, germanium (Ge), selenium (Se) or tellurium (Te), etc., may be used as the n-type impurity. The active layer 33 is formed on the n-type semiconductor layer 32.

The active layer 33 is formed to have a single quantum well structure with one well layer 332. A band gap of the active layer 33 is adjusted so that ultraviolet light at a central wavelength of more than 320 nm and not more than 365 nm can be output. The active layer 33 has a barrier layer 331 and the well layer 332 in this order from the n-type semiconductor layer 32 side.

The barrier layer 331 is made of $Al_rGa_{1-r}N$ ($0 \leq r \leq 1$). An Al composition ratio r of the barrier layer 331 is higher than the Al composition ratio q of the n-type semiconductor layer 32 (i.e., $r > q$). The Al composition ratio r of the barrier layer 331 is, e.g., not less than 50%. A film thickness of the barrier layer 331 is, e.g., not less than 5 nm and not more than 50 nm.

The well layer 332 is made of $Al_sGa_{1-s}N$ ($0 < s < 1$). An Al composition ratio s of the well layer 332 is lower than the Al composition ratio q of the n-type semiconductor layer 32 (i.e., $s < q$). The Al composition ratio s of the well layer 332 is preferably not more than 10%, more preferably less than 6%, from the viewpoint of improving light output and narrowing a full width at half maximum (FWHM) of an emission spectrum of the light-emitting element 1. Hereafter, the full width at half maximum of the emission spectrum of the light-emitting element 1 is sometimes simply referred to as "the full width at half maximum".

A composition difference q-s obtained by subtracting the Al composition ratio s of the well layer 332 from the Al composition ratio q of the n-type semiconductor layer 32 is not less than 22%. As a result, the light output of the light-emitting element 1 is improved. From this point of view, the composition difference q-s is more preferably not less than 28%. If the Al composition ratio of the n-type semiconductor layer 32 is excessively high, the electrical resistance value of the n-type semiconductor layer 32 becomes excessively high, hence, the composition difference q-s is preferably not more than 34% from the viewpoint of suppressing the electrical resistance value of the n-type semiconductor layer 32 while suppressing a decrease in performance of the light-emitting element 1. A film thickness of the well layer 332 is, e.g., not less than 1 nm and not more than 5 nm. The electron blocking layer 34 is formed on the well layer 332.

The electron blocking layer 34 serves to improve efficiency of electron injection into the active layer 33 by suppressing occurrence of the overflow phenomenon in which electrons leak from the active layer 33 to the p-type semiconductor layer 35 side (hereinafter, also referred to as the electron blocking effect). The electron blocking layer 34 has a stacked structure in which a first layer 341 and a second layer 342 are stacked in this order from the lower side.

The first layer 341 is provided on the active layer 33. The first layer 341 is made of, e.g., $Al_tGa_{1-t}N$ ($0 < t \leq 1$). An Al composition ratio t of the first layer 341 is, e.g., not less than 90%. A film thickness of the first layer 341 is, e.g., not less than 0.5 nm and not more than 5.0 nm.

The second layer 342 is made of, e.g., $Al_uG_{1-u}N$ ($0 < u < 1$). An Al composition ratio u of the second layer 342 is lower than the Al composition ratio t of the first layer 341 and is, e.g., not less than 70% and not more than 90%. A film thickness of the second layer 342 is larger than the film thickness of the first layer 341 and is, e.g., not less than 15 nm and not more than 100 nm.

When the first layer 341 with a relatively high Al composition ratio has an excessively large film thickness, it causes an excessive increase in the electrical resistance value of the entire light-emitting element 1 since a semiconductor layer with a higher Al composition ratio has a higher electrical resistance value. For this reason, the film thickness of the first layer 341 is preferably small to some extent. On the other hand, if the film thickness of the first layer 341 is reduced, it increases the probability that electrons pass through the first layer 341 from the lower side to the upper side due to the tunnel effect. Therefore, in the light-emitting element 1 of the first embodiment, the second layer 342 is formed on the first layer 341 to suppress passage of electrons through the entire electron blocking layer 34.

Each of the first layer 341 and the second layer 342 can be an undoped layer, a layer containing an n-type impurity, a layer containing a p-type impurity, or a layer containing both an n-type impurity and a p-type impurity. Magnesium (Mg) can be used as the p-type impurity, but zinc (Zn), beryllium (Be), calcium (Ca), strontium (Sr), barium (Ba) or carbon (C), etc., may be used other than magnesium. The same applies to the other semiconductor layers containing a p-type impurity. When each electron blocking layer 34 contains an impurity, the impurity in each electron blocking layer 34 may be contained in the entire portion of each electron blocking layer 34 or may be contained in a part of each electron blocking layer 34. The p-type semiconductor layer 35 is formed on the electron blocking layer 34.

In the first embodiment, the p-type semiconductor layer 35 is composed of a p-type contact layer. The p-type contact layer is a layer connected to the p-side electrode 5 (described later) and is made of $Al_vGa_{1-v}N$ ($0 \leq v \leq 1$) doped with a high concentration of a p-type impurity. The p-type semiconductor layer 35 as the p-type contact layer is configured to have a low Al composition ratio to achieve an ohmic contact with the A-side electrode 5, and from such a viewpoint, the p-type semiconductor layer 35 is preferably made of p-type gallium nitride (GaN).

The n-side electrode 4 is formed on an upper surface of the n-type semiconductor layer 32. The n-side electrode 4 can be, e.g., a multilayered film formed by sequentially stacking titanium (Ti), aluminum, titanium and gold (Au) on the n-type semiconductor layer 32. When the light-emitting element 1 is flip-chip mounted as described below, the n-side electrode 4 may be composed of a material that can reflect ultraviolet light emitted by the active layer 33.

The p-side electrode 5 is formed on an upper surface of the p-type semiconductor layer 35. The p-side electrode 5 can be, e.g., a multilayered film formed by sequentially stacking nickel (Ni) and gold on the p-type semiconductor layer 35. When the light-emitting element 1 is flip-chip mounted as described below, the p-side electrode 5 may be composed of a material that can reflect ultraviolet light emitted by the active layer 33.

The light-emitting element 1 can be used in a state of being flip-chip mounted on a package substrate (not shown). That is, the light-emitting element 1 is mounted such that a side in the up-and-down direction, which is a side where the n-side electrode 4 and the p-side electrode 5 are provided, faces the package substrate and each of the n-side electrode 4 and the p-side electrode 5 is attached to the package substrate via a gold bump, etc. Light from the flip-chip mounted light-emitting element 1 is extracted on the substrate 2 side (i.e., on the lower side). However, it is not limited thereto and the light-emitting element may be mounted on the package substrate by wire bonding, etc. In addition, although the light-emitting element 1 in the first embodiment is a so-called lateral light-emitting element in which both the n-side electrode 4 and the p-side electrode 5 are provided on the upper side of the nitride semiconductor layer 3, the light-emitting element 1 is not limited thereto and may be a vertical light-emitting element. The vertical light-emitting element is a light-emitting element in which the nitride semiconductor layer is sandwiched between the n-side electrode and the p-side electrode. In this regard, when the light-emitting element is of the vertical type, the substrate and the buffer layer are preferably removed by laser lift-off, etc.

Method for manufacturing the nitride semiconductor light-emitting element 1 Next, an example of a method for manufacturing the light-emitting element 1 will be described.

In the first embodiment, each layer of the nitride semiconductor layer 3 is epitaxially grown on the disc-shaped substrate 2 by the Metal Organic Chemical Vapor Deposition (MOCVD) method. That is, in the first embodiment, the disc-shaped substrate 2 is placed in a chamber and the nitride semiconductor layer 3 is formed on the substrate 2 by introducing source gases of each layer to be formed on the substrate 2 into the chamber. As the source gases to epitaxially grow each layer, it is possible to use trimethylaluminum (TMA) as an aluminum source, trimethylgallium (TMG) as a gallium source, ammonia ($NH_3$) as a nitrogen source, tetramethylsilane (TMSi) as a silicon source, and biscyclopentadienylmagnesium ($Cp_2Mg$) as a magnesium source. The manufacturing conditions for epitaxially growing each layer, such as growth temperature, growth pressure and growth time, etc., can be general conditions according to the configuration of each layer.

The MOCVD method is sometimes called the Metal Organic Vapor Phase Epitaxy (MOVPE) method. To epitaxially grow each layer of the nitride semiconductor layer 3 on the substrate 2, it is also possible to use another epitaxial growth method such as the Molecular Beam Epitaxy (MBE) method or the Hydride Vapor Phase Epitaxy (HVPE) method, etc.

After forming the nitride semiconductor layer 3 on the disc-shaped substrate 2, a mask is formed on a portion of the p-type semiconductor layer 35, i.e., a part other than the portion to be an exposed surface 321 of the n-type semiconductor layer 32. Then, the region in which the mask is not formed is removed by etching from the upper surface of the p-type semiconductor layer 35 to the middle of the n-type semiconductor layer 32 in the up-and-down direction. The exposed surface 321 exposed upward is thereby formed on the n-type semiconductor layer 32. After forming the exposed surface 321, the mask is removed.

Subsequently, the n-side electrode 4 is formed on the exposed surface 321 of the n-type semiconductor layer 32 and the p-side electrode 5 is formed on the p-type semiconductor layer 35. The n-side electrode 4 and the p-side electrode 5 may be formed by, e.g., a well-known method such as the electron beam evaporation method or the sputtering method. The object completed through the above process is cut into pieces with a desired dimension. Plural light-emitting elements 1 as shown in FIG. 1 are thereby obtained from one wafer.

Second Embodiment

Figure 2:
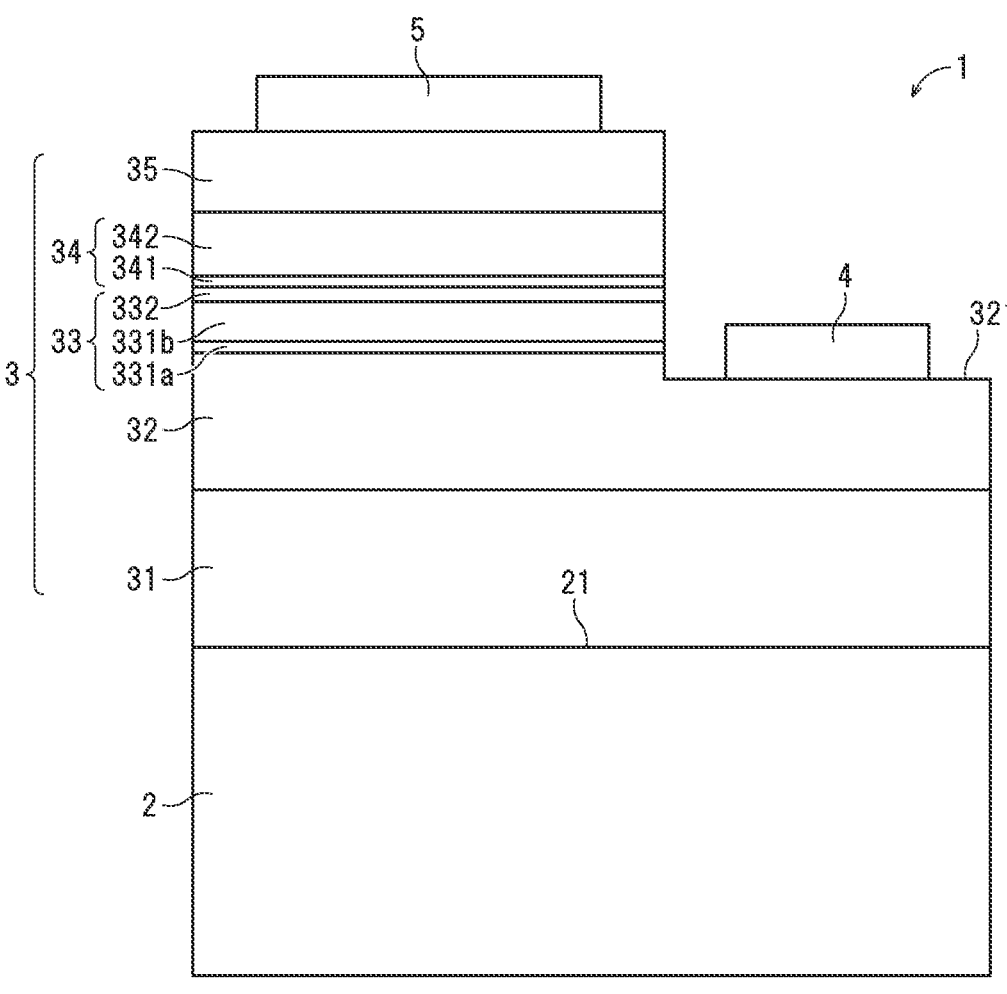
FIG. 2 is a schematic diagram illustrating a configuration of a nitride semiconductor light-emitting element in the second embodiment.

FIG. 2 is a schematic diagram illustrating a configuration of the light-emitting element 1 in the second embodiment.

The second embodiment is different from the first embodiment in that the central emission wavelength is not less than 300 nm and not more than 320 nm and the configurations of the n-type semiconductor layer 32 and the active layer 33 are changed.

The n-type semiconductor layer 32 in the second embodiment may be lattice-relaxed or coherently grown. The Al composition ratio q of the n-type semiconductor layer 32 is not specifically limited, and as an example, the Al composition ratio q can be not less than 30% and not more than 70%. The film thickness of the n-type semiconductor layer 32 is preferably not less than 1 μm and not more than 4 μm. By setting the film thickness of the n-type semiconductor layer 32 to not less than 1 μm, an increase in the electrical resistance value of the entire light-emitting element 1 due to a small cross-sectional area of the n-type semiconductor layer 32 can be suppressed. By setting the film thickness of the n-type semiconductor layer 32 to not more than 4 μm, a wasteful increase in film formation time of the n-type semiconductor layer 32 is suppressed and productivity of the light-emitting element 1 is improved.

The active layer 33 has a single quantum well structure in the same manner as that in the first embodiment. A band gap of the active layer 33 is adjusted so that ultraviolet light at a central wavelength of not less than 300 nm and not more than 320 nm can be output. The active layer 33 includes a first barrier layer 331a, a second barrier layer 331b and the well layer 332 in this order from the n-type semiconductor layer 32 side.

The first barrier layer 331a is made of $Al_{r1}Ga_{1-r1}N$ ($0<r1\leq1$), and the second barrier layer 331b is made of $Al_{r2}Ga_{1-r2}N$ ($0<r2\leq1$). An Al composition ratio r1 of the first barrier layer 331a is higher than an Al composition ratio r2 of the second barrier layer 331b (i.e., r1>r2). The Al composition ratio r1 of the first barrier layer 331a is, e.g., not less than 80% and the Al composition ratio r2 of the second barrier layer 331b is higher than the Al composition ratio s of the well layer 332 and is, e.g., not less than 65% and not more than 95%. A film thickness of the first barrier layer 331a is smaller than a film thickness of the second barrier layer 331b. The first barrier layer 331a is a layer with the high Al composition ratio r1, and if the film thickness thereof is increased too much, the electrical resistance value of the entire light-emitting element 1 increases, hence, the film thickness of the first barrier layer 331a is preferably smaller than the film thickness of the second barrier layer 331b. The film thickness of the first barrier layer 331a is, e.g., not less than 1 nm and not more than 5 nm, and the film thickness of the second barrier layer 331b is, e.g., not less than 5 nm and not more than 20 nm.

The Al composition ratio s of the well layer 332 is preferably not less than 15% and not more than 26%, and more preferably further satisfies not more than 22%, from the viewpoint of improving light output. The Al composition ratio s of the well layer 332 is also preferably not less than 18% from the viewpoint of narrowing the full width at half maximum of the emission spectrum of the light-emitting element 1.

The composition difference q-s obtained by subtracting the Al composition ratio s of the well layer 332 from the Al composition ratio q of the n-type semiconductor layer 32 is preferably not less than 28% and not more than 41% from the viewpoint of improving light output. Meanwhile, from the viewpoint of narrowing the full width at half maximum of the emission spectrum of the light-emitting element 1, it is preferable that the n-type semiconductor layer 32 satisfy at least one of an Al composition ratio of more than 50% and a film thickness of not more than 2 µm (i.e., the n-type semiconductor layer 32 be formed by coherent growth) and the composition difference q-s satisfy not less than 30% and not more than 40%.

The other configurations are the same as in the first embodiment. Among the reference signs used in the second embodiment onwards, the same reference signs as those used in the already-described embodiment indicate the same constituent elements, etc., as those in the already-described embodiment, unless otherwise specified.

Third Embodiment

Figure 3:
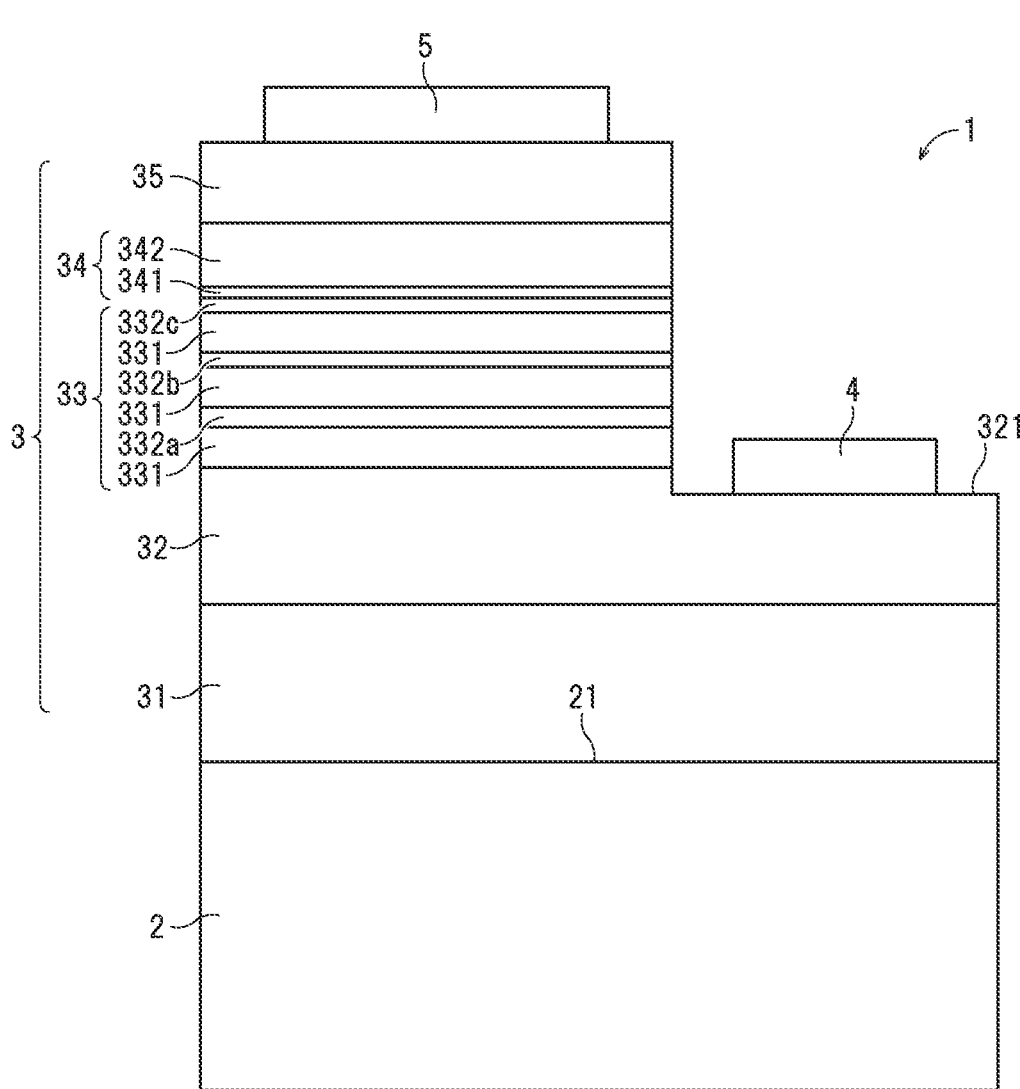
FIG. 3 is a schematic diagram illustrating a configuration of a nitride semiconductor light-emitting element in the second embodiment.

FIG. 3 is a schematic diagram illustrating a configuration of the light-emitting element 1 in the third embodiment.

The third embodiment is different from first embodiment in that the central emission wavelength is not less than 265 nm and less than 300 nm, the n-type semiconductor layer 32 is formed by coherent growth, and the active layer 33 has a multi quantum well (MQW) structure.

When, as in the third embodiment, the central wavelength of ultraviolet light emitted by the light-emitting element 1 is not less than 265 nm and less than 300 nm and the active layer 33 has a multi quantum well structure with plural well layers 332a to 332c, forming the n-type semiconductor layer 32 by coherent growth improves the light output of the light-emitting element 1. The reason for this is presumably that when the central wavelength of ultraviolet light emitted by the light-emitting element 1 is not less than 265 nm and less than 300 nm and the active layer 33 has a multi quantum well structure, forming the n-type semiconductor layer 32 by coherent growth results in that strain of the n-type semiconductor layer 32 is relaxed in the active layer 33 having a multi quantum well structure, which causes strain generated in the well layer 332c located uppermost to be suitable for light emission. When the active layer 33 has a multi quantum well structure, the well layer 332c, which is located closest to the p-type semiconductor layer 35 among the plural well layers 332a to 332c constituting the active layer 33 (that is, the uppermost well layer 332c described later), tends to emit light most strongly. In addition, when the central wavelength of ultraviolet light emitted by the light-emitting element 1 is as short as not less than 265 nm and less than 300 nm, there is a tendency that light in directions other than the c-axis direction of the substrate 2 (i.e., light in an a-axis direction, an m-axis direction, etc.) becomes strong and it is difficult to extract ultraviolet light from the substrate 2 to the lower side, but light output from the lower side of the substrate 2 can be improved in the third embodiment.

In the third embodiment, the n-type semiconductor layer 32 is formed by coherent growth by satisfying the Al composition ratio of more than 50%. The Al composition ratio of the n-type semiconductor layer 32 further satisfies not more than 70%. The film thickness of the n-type semiconductor layer 32 is preferably not less than 1 µm and not more than 4 µm. By setting the film thickness of the n-type semiconductor layer 32 to not less than 1 µm, an increase in the electrical resistance value of the entire light-emitting element 1 due to a small cross-sectional area of the n-type semiconductor layer 32 can be suppressed. By setting the film thickness of the n-type semiconductor layer 32 to not more than 4 µm, a wasteful increase in film formation time of the n-type semiconductor layer 32 is suppressed and productivity of the light-emitting element 1 is improved.

The Al composition ratio q of the n-type semiconductor layer 32 and a film thickness d [µm] of the n-type semiconductor layer 32 preferably satisfy a relationship $4.1q-0.6 \leq d \leq 4.1q$. The higher the Al composition ratio of the n-type semiconductor layer 32, the lower its carrier concentration and the higher its electric resistance value, hence, an increase in the electrical resistance value of the n-type semiconductor layer 32 can be suppressed by increasing the film thickness d in accordance with the increase in the Al composition ratio of the n-type semiconductor layer 32.

The active layer 33 is formed to have a multi quantum well structure with the plural well layers 332a to 332c. A band gap of the active layer 33 is adjusted so that ultraviolet light at a central wavelength of not less than 265 nm and less than 300 nm can be output. In the third embodiment, active layer 33 including three barrier layers 331 and three well layers 332a to 332c will be described as an example. The number of well layers 332a to 332c in the active layer 33 is preferably not more than three from the viewpoint of improving light output.

The barrier layers 331 and the well layers 332a to 332c are alternately stacked. The barrier layer 331 is formed at a lower end of the active layer 33 and the well layer 332c is formed at an upper end of the active layer 33. The configuration of each barrier layer 331 can be the same as that in the first embodiment.

Among the three well layers 332a to 332c, the well layer arranged lowermost is referred to as the lowermost well layer 332a, the well layer arranged uppermost is referred to as the uppermost well layer 332c, and the well layer arranged between the lowermost well layer 332a and the uppermost well layer 332c is referred to as the intermediate well layer 332b. In the third embodiment, the three well layers 332a to 332c are configured such that the lowermost well layer 332a has a different configuration from the well layers other than the lowermost well layer 332a (i.e., the intermediate well layer 332b and the uppermost well layer 332c). A film thickness of the lowermost well layer 332a is larger than a film thickness of each of the intermediate well layer 332b and the uppermost well layer 332c. The lowermost well layer 332a is thereby flattened and flatness of each layer formed on the lowermost well layer 332a in the active layer 33 is also improved, resulting in improved monochromaticity of output light. For example, the film thickness of the lowermost well layer 332a can be not less than 4 nm and not more than 6 nm and the film thickness of each of the intermediate well layer 332b and the uppermost well layer 332c can be not less than 2 nm and not more than 4 nm. An Al composition ratio of each of the three well layers 332a to 332c can be, e.g., not less than 25% and not more than 45%. The Al composition ratio of each of the three well layers 332a to 332c is preferably not less than 28% and not more than 36% from the viewpoint of improving light output and narrowing the full width at half maximum. In addition, the Al composition ratio of the lowermost well layer 332a may be higher than the Al composition ratio of each of the intermediate well layer 332b and the uppermost well layer 332c. This makes a difference in the Al composition ratio between the n-type semiconductor layer 32 and the lowermost well layer 332a relatively small, and crystallinity of each layer of the active layer 33 is improved.

The composition difference q-s obtained by subtracting the Al composition ratio s of the uppermost well layer 332c from the Al composition ratio q of the n-type semiconductor layer 32 is preferably not less than 15% and not more than 31%, more preferably not more than 20% and less than 30%, from the viewpoint of improving light output. Meanwhile, the composition difference q-s is preferably not more than 22% from the viewpoint of narrowing the full width at half maximum of the light-emitting element 1.

The other configurations are the same as in the first embodiment.

EXPERIMENT EXAMPLE

In this Experiment Example, a large number of light-emitting elements, which are different in emission wavelength, the configuration of the active layer and the growth mode of the n-type semiconductor layer, etc., were prepared, and the light output and full width at half maximum of each light-emitting element were measured.

In this Experiment Example, light-emitting elements as Samples 1 to 131 were prepared. First, the general configurations of Samples 1 to 131 are shown in Table 1.

TABLE 1

|  | Structure of Active layer | Number of Well layers | Number of Barrier layers | Growth mode of n-type semiconductor layer |
|---|---|---|---|---|
| Samples 1-17 | SQW | 1 | 1 | Lattice relaxation |
| Samples 18-39 | SQW | 1 | 2 | Lattice relaxation |
| Samples 40-53 | SQW | 1 | 2 | Coherent |
| Sample 54 | SQW | 1 | 1 | Coherent |
| Samples 55-72 | MQW | 3 | 3 | Lattice relaxation |
| Samples 73-129 | MQW | 3 | 3 | Coherent |
| Sample 130 | MQW | 4 | 4 | Coherent |
| Sample 131 | MQW | 2 | 2 | Coherent |

In Table 1, "SQW" means a single quantum well structure and "MQW" means a multi quantum well structure. The column for Growth mode of n-type semiconductor layer shows whether lattice relaxation occurred in the n-type semiconductor layer or the n-type semiconductor layer was coherently grown. The growth mode of the n-type semiconductor layer was determined to be lattice relaxation when satisfying the conditions that the Al composition ratio of the n-type semiconductor layer is not less than 50% and the film thickness of the n-type semiconductor layer is more than 2 μm, and the growth mode of the n-type semiconductor layer was determined to be coherent growth when not satisfying these conditions. It has already been confirmed that lattice relaxation occurs in the n-type semiconductor layer when satisfying these conditions and coherent growth of the n-type semiconductor layer occurs when outside of these conditions.

The configuration of Samples 1-17, the configuration of Samples 18-39, the configuration of Samples 40-53, the configuration of Sample 54, the configuration of Samples 55-72, the configuration of Samples 73-129, the configuration of Sample 130 and the configuration of Sample 131 are shown in detail respectively in Tables 2 to 9.

TABLE 2

| Structure (Samples 1-17) | | Film thickness | Al composition ratio [%] |
|---|---|---|---|
| Substrate | | 430 ± 25 [um] | — |
| Buffer layer | | 2000 ± 200 [nm] | 100 |
| n-type semiconductor layer | | 2000-3500 [nm] | 40 ± 10 |
| Active layer | Barrier layer | 10 ± 5 [nm] | 80 ± 15 |
| | Well layer | 3 ± 1 [nm] | 0-50 |
| Electron blocking layer | First layer | 2 ± 1 [nm] | 95 ± 5 |
| | Second layer | 20 ± 10 [nm] | 75 ± 15 |
| p-type semiconductor layer | | 700 ± 100 [nm] | 0 |

TABLE 3

| Structure (Samples 18-39) | | Film thickness | Al composition ratio [%] |
|---|---|---|---|
| Substrate | | 430 ± 25 [um] | — |
| Buffer layer | | 2000 ± 200 [nm] | 100 |
| n-type semiconductor layer | | 2000-3500 [nm] | 40 ± 10 |
| Active layer | First barrier layer | 2 ± 1 [nm] | 95 ± 5 |
| | Second barrier layer | 10 ± 5 [nm] | 80 ± 15 |
| | Well layer | 3 ± 1 [nm] | 0-50 |
| Electron blocking layer | First layer | 2 ± 1 [nm] | 95 ± 5 |
| | Second layer | 20 ± 10 [nm] | 75 ± 15 |
| p-type semiconductor layer | | 700 ± 100 [nm] | 0 |

TABLE 4

| Structure (Samples 40-53) | | Film thickness | Al composition ratio [%] |
|---|---|---|---|
| Substrate | | 430 ± 25 [um] | — |
| Buffer layer | | 2000 ± 200 [nm] | 100 |
| n-type semiconductor layer | | 1500-3500 [nm] | 60 ± 10 |
| Active layer | First barrier layer | 2 ± 1 [nm] | 95 ± 5 |
| | Second barrier layer | 10 ± 5 [nm] | 80 ± 15 |
| | Well layer | 3 ± 1 [nm] | 0-50 |
| Electron blocking layer | First layer | 2 ± 1 [nm] | 95 ± 5 |
| | Second layer | 20 ± 10 [nm] | 75 ± 15 |
| p-type semiconductor layer | | 700 ± 100 [nm] | 0 |

TABLE 5

| Structure (Sample 54) | | Film thickness | Al composition ratio [%] |
|---|---|---|---|
| Substrate | | 430 ± 25 [um] | — |
| Buffer layer | | 2000 ± 200 [nm] | 100 |
| n-type semiconductor layer | | 1500-3500 [nm] | 60 ± 10 |
| Active layer | Barrier layer | 10 ± 5 [nm] | 80 ± 15 |
| | Well layer | 3 ± 1 [nm] | 0-50 |
| Electron blocking layer | First layer | 2 ± 1 [nm] | 95 ± 5 |
| | Second layer | 20 ± 10 [nm] | 75 ± 15 |
| p-type semiconductor layer | | 700 ± 100 [nm] | 0 |

TABLE 6

| Structure (Samples 55-72) | | Film thickness | Al composition ratio [%] |
|---|---|---|---|
| Substrate | | 430 ± 25 [um] | — |
| Buffer layer | | 2000 ± 200 [nm] | 100 |
| n-type semiconductor layer | | 2000-3500 [nm] | 40 ± 10 |
| Active layer (3QW) | Barrier layer | 10 ± 5 [nm] | 80 ± 15 |
| | Well layer (Lowermost well layer) | 5 ± 1 [nm] | 0-50 |
| | Barrier layer | 10 ± 5 [nm] | 80 ± 15 |
| | Well layer (Intermediate well layer) | 3 ± 1 [nm] | 0-50 |
| | Barrier layer | 10 ± 5 [nm] | 80 ± 15 |
| | Well layer (Uppermost well layer) | 3 ± 1 [nm] | 0-50 |
| Electron layer blocking | First layer | 2 ± 1 [nm] | 95 ± 5 |
| | Second layer | 20 ± 10 [nm] | 75 ± 15 |
| p-type semiconductor layer | | 700 ± 100 [nm] | 0 |

TABLE 7

| Structure (Samples 73-129) | | Film thickness | Al composition ratio [%] |
|---|---|---|---|
| Substrate | | 430 ± 25 [um] | — |
| Buffer layer | | 2000 ± 200 [nm] | 100 |
| n-type semiconductor layer | | 1500-3500 [nm] | 60 ± 10 |
| Active layer (3QW) | Barrier layer | 10 ± 5 [nm] | 80 ± 15 |
| | Well layer (Lowermost well layer) | 5 ± 1 [nm] | 0-50 |
| | Barrier layer | 10 ± 5 [nm] | 80 ± 15 |
| | Well layer (Intermediate well layer) | 3 ± 1 [nm] | 0-50 |
| | Barrier layer | 10 ± 5 [nm] | 80 ± 15 |
| | Well layer (Uppermost well layer) | 3 ± 1 [nm] | 0-50 |
| Electron blocking layer | First layer | 2 ± 1 [nm] | 95 ± 5 |
| | Second layer | 20 ± 10 [nm] | 75 ± 15 |
| p-type semiconductor layer | | 700 ± 100 [nm] | 0 |

TABLE 8

| Structure (Sample 130) | | Film thickness | Al composition ratio [%] |
|---|---|---|---|
| Substrate | | 430 ± 25 [um] | — |
| Buffer layer | | 2000 ± 200 [nm] | 100 |
| n-type semiconductor layer | | 1500-3500 [nm] | 60 ± 10 |
| Active layer (4QW) | Barrier layer | 10 ± 5 [nm] | 80 ± 15 |
| | Well layer (Lowermost well layer) | 5 ± 1 [nm] | 0-50 |
| | Barrier layer | 10 ± 5 [nm] | 80 ± 15 |
| | Well layer (Intermediate well layer) | 3 ± 1 [nm] | 0-50 |
| | Barrier layer | 10 ± 5 [nm] | 80 ± 15 |
| | Well layer (Intermediate | 3 ± 1 [nm] | 0-50 |

TABLE 8-continued

| Structure (Sample 130) | | Film thickness | Al composition ratio [%] |
|---|---|---|---|
| well layer) | | | |
| Barrier layer | | 10 ± 5 [nm] | 80 ± 15 |
| Well layer (Uppermost well layer) | | 3 ± 1 [nm] | 0-50 |
| Electron layer blocking | First layer | 2 ± 1 [nm] | 95 ± 5 |
| | Second layer | 20 ± 10 [nm] | 75 ± 15 |
| p-type semiconductor layer | | 700 ± 100 [nm] | 0 |

TABLE 9

| Structure (Sample 131) | | Film thickness | Al composition ratio [%] |
|---|---|---|---|
| Substrate | | 430 ± 25 [um] | — |
| Buffer layer | | 2000 ± 200 [nm] | 100 |
| n-type semiconductor layer | | 1500-3500 [nm] | 60 ± 10 |
| Active layer (2QW) | Barrier layer | 10 ± 5 [nm] | 80 ± 15 |
| | Well layer (Lowermost well layer) | 5 ± 1 [nm] | 0-50 |
| | Barrier layer | 10 ± 5 [nm] | 80 ± 15 |
| | Well layer (Uppermost well layer) | 3 ± 1 [nm] | 0-50 |
| Electron layer blocking | First layer | 2 ± 1 [nm] | 95 ± 5 |
| | Second layer | 20 ± 10 [nm] | 75 ± 15 |
| p-type semiconductor layer | | 700 ± 100 [nm] | 0 |

The film thickness of each layer shown in Tables 2 to 9 was measured by a transmission electron microscope. The Al composition ratio of each layer shown in Tables 2 to 9 is a value estimated from secondary ion intensity of Al measured by Secondary Ion Mass Spectrometry (SIMS).

In this Experiment Example, the light output and full width at half maximum of each of Samples 1 to 131 were measured. The light output of each sample is light output when applying a current of 20 mW to each sample in the on-wafer state. Measurement of the light output of each sample was conducted by a photodetector placed under each of Samples 1 to 131 (i.e., placed on the substrate side).

Figure 4:
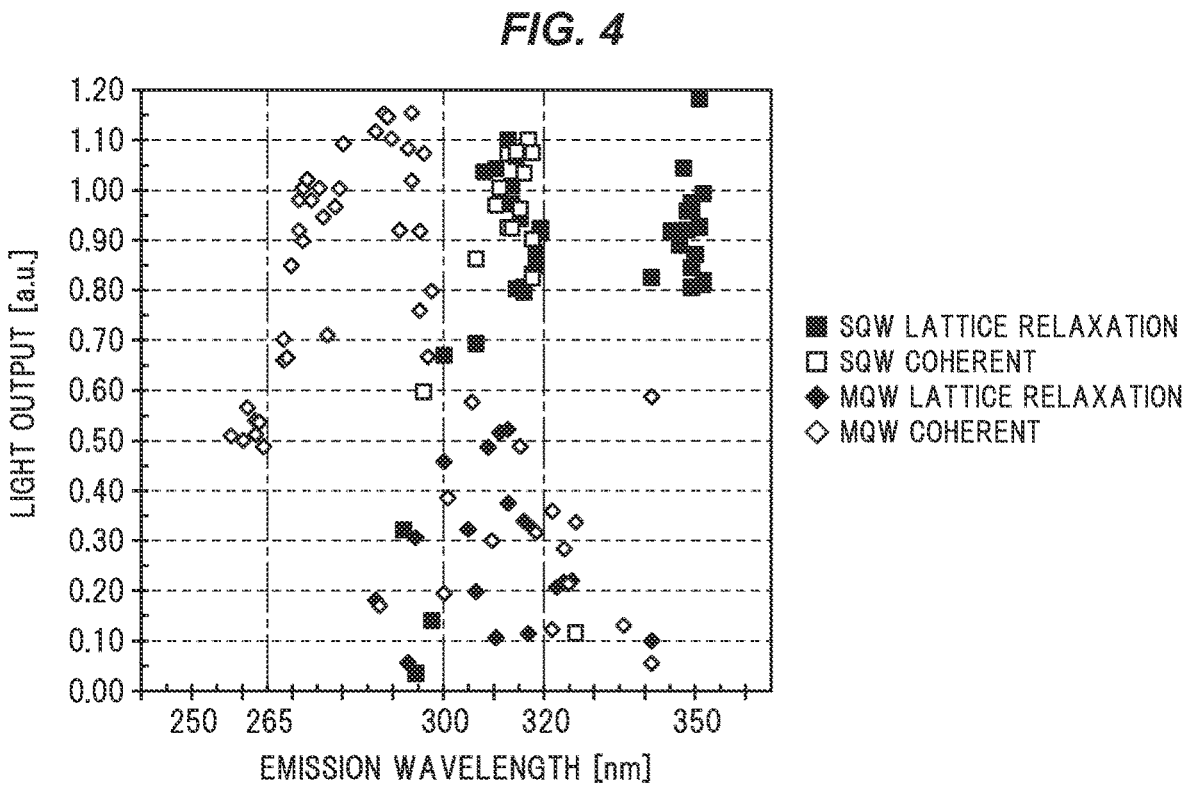
FIG. 4 is a graph showing a relationship between emission wavelength and light output in Experiment Example.
Figure 5:
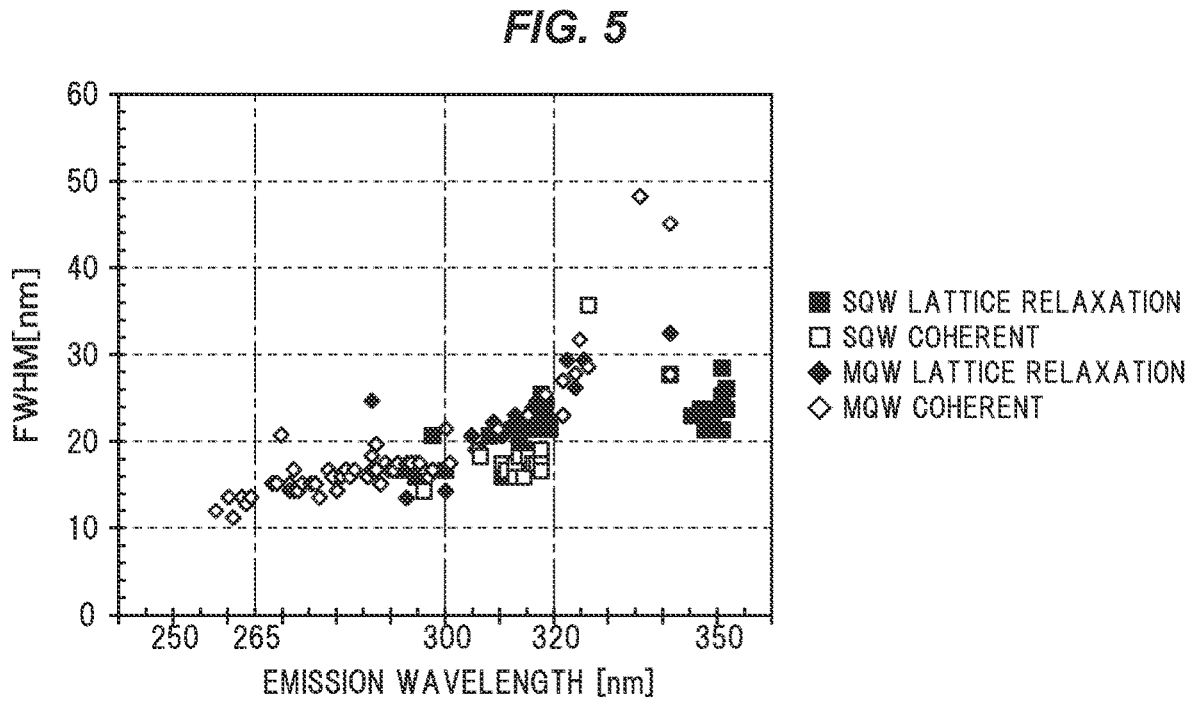
FIG. 5 is a graph showing a relationship between emission wavelength and full width at half maximum in Experiment Example.

Tables 10 to 18 show the specific configurations of the main portions and the relationship between emission wavelength, light output and full width at half maximum for each sample. In addition, FIG. 4 shows a relationship between emission wavelength and light output for each sample, and FIG. 5 shows a relationship between emission wavelength and full width at half maximum (FWHM) for each sample. In FIGS. 4 and 5, measurement results for the samples, which are configured such that the active layer has a single quantum well structure and the growth mode of the n-type semiconductor layer is lattice relaxation, are plotted as black filled squares, measurement results for the samples, which are configured such that the active layer has a single quantum well structure and the growth mode of the n-type semiconductor layer is coherent growth, are plotted as open squares, measurement results for the samples, which are configured such that the active layer has a multi quantum well structure and the growth mode of the n-type semiconductor layer is lattice relaxation, are plotted as black filled diamonds, and measurement results for the samples, which are configured such that the active layer has a multi quantum well structure and the growth mode of the n-type semiconductor layer is coherent growth, are plotted as open diamonds.

TABLE 10

| | n-type semiconductor layer | | Well layer | | Barrier layer | | | | |
| | Al composition ratio q [%] | Film thick-ness [nm] | Al composition ratio s [%] | Film thick-ness [nm] | Al composition ratio [%] | Composition difference q-s [%] | Emission wavelength [nm] | Light output [a.u.] | FWHM [nm] |
| Sample | | | | | | | | | |
| --- | --- | --- | --- | --- | --- | --- | --- | --- | --- |
| 1 | 35.0 | 2.960 | 1.1 | 2 | 60 | 33.9 | 351.654 | 0.82 | 26.086 |
| 2 | 35.0 | 3.042 | 1.5 | 2 | 60 | 33.5 | 350.863 | 1.18 | 25.300 |
| 3 | 35.0 | 3.042 | 4.1 | 2 | 60 | 30.9 | 345.325 | 0.92 | 22.956 |
| 4 | 35.0 | 2.989 | 3.0 | 2 | 60 | 32.0 | 347.699 | 1.04 | 21.364 |
| 5 | 35.0 | 3.423 | 3.3 | 2 | 60 | 31.7 | 346.908 | 0.89 | 23.743 |
| 6 | 35.0 | 3.251 | 2.6 | 2 | 60 | 32.4 | 348.490 | 0.96 | 22.154 |
| 7 | 35.0 | 3.258 | 2.2 | 2 | 60 | 32.8 | 349.282 | 0.98 | 22.152 |
| 8 | 35.0 | 3.240 | 2.2 | 2 | 60 | 32.8 | 349.282 | 0.81 | 22.944 |
| 9 | 35.0 | 3.251 | 1.1 | 2 | 60 | 33.9 | 351.654 | 0.81 | 26.086 |
| 10 | 35.0 | 3.072 | 2.2 | 2 | 60 | 32.8 | 349.282 | 0.96 | 22.944 |
| 11 | 35.0 | 3.064 | 2.6 | 2 | 60 | 32.4 | 348.490 | 0.92 | 22.947 |
| 12 | 35.0 | 3.036 | 1.8 | 2 | 60 | 33.2 | 350.073 | 0.87 | 23.732 |
| 13 | 35.0 | 3.119 | 1.1 | 2 | 60 | 33.9 | 351.654 | 0.99 | 23.721 |
| 14 | 35.0 | 3.173 | 1.5 | 2 | 60 | 33.5 | 350.863 | 0.93 | 21.354 |
| 15 | 35.0 | 3.119 | 1.5 | 2 | 60 | 33.5 | 350.863 | 0.93 | 28.462 |
| 16 | 35.0 | 3.041 | 2.2 | 2 | 60 | 32.8 | 349.282 | 0.84 | 22.944 |
| 17 | 35.0 | 3.004 | 6.0 | 2 | 60 | 29.0 | 341.367 | 0.83 | 27.715 |

TABLE 11

| | n-type semiconductor layer | | Well layer | | First barrier layer | Second barrier layer | | | | |
| | Al composition ratio q [%] | Film thick-ness [nm] | Al composition ratio s [%] | Film thick-ness [nm] | Al composition ratio [%] | Al composition ratio [%] | Composition difference q-s [%] | Emission wavelength [nm] | Light output [a.u.] | FWHM [nm] |
| Sample | | | | | | | | | | |
| --- | --- | --- | --- | --- | --- | --- | --- | --- | --- | --- |
| 18 | 48.0 | 3.031 | 29.5 | 3.5 | 100 | 65 | 18.5 | 292.129 | 0.32 | 16.724 |
| 19 | 48.0 | 3.061 | 28.3 | 3.5 | 100 | 65 | 19.7 | 294.518 | 0.04 | 15.924 |
| 20 | 48.0 | 3.043 | 26.8 | 3.5 | 100 | 65 | 21.2 | 297.702 | 0.14 | 20.689 |
| 21 | 48.0 | 3.038 | 25.7 | 3.5 | 100 | 65 | 22.3 | 300.090 | 0.67 | 16.709 |
| 22 | 48.0 | 3.085 | 22.6 | 3.5 | 100 | 65 | 25.4 | 306.454 | 0.69 | 18.286 |
| 23 | 48.0 | 3.059 | 21.9 | 3.5 | 100 | 65 | 26.1 | 308.044 | 1.04 | 20.668 |
| 24 | 48.0 | 2.607 | 17.3 | 3.5 | 100 | 65 | 30.7 | 317.578 | 0.83 | 21.444 |
| 25 | 48.0 | 3.025 | 19.2 | 3.5 | 100 | 65 | 28.8 | 313.607 | 1.01 | 20.658 |
| 26 | 48.0 | 2.598 | 19.2 | 3.5 | 100 | 65 | 28.8 | 313.607 | 0.97 | 19.070 |
| 27 | 48.0 | 3.023 | 18.5 | 3.5 | 100 | 65 | 29.5 | 315.196 | 0.94 | 18.271 |
| 28 | 48.0 | 2.607 | 18.8 | 3.5 | 100 | 65 | 29.2 | 314.401 | 1.07 | 19.067 |
| 29 | 48.0 | 2.605 | 18.1 | 3.5 | 100 | 65 | 29.9 | 315.990 | 0.80 | 22.244 |
| 30 | 48.0 | 2.594 | 18.1 | 3.5 | 100 | 65 | 29.9 | 315.990 | 0.80 | 22.241 |
| 31 | 48.0 | 2.604 | 18.8 | 3.5 | 100 | 65 | 29.2 | 314.401 | 0.80 | 22.248 |
| 32 | 48.0 | 2.605 | 18.1 | 3.5 | 100 | 65 | 29.9 | 315.990 | 0.81 | 21.446 |
| 33 | 48.0 | 2.592 | 17.0 | 3.5 | 100 | 65 | 31.0 | 318.372 | 0.85 | 23.820 |
| 34 | 48.0 | 2.587 | 16.6 | 3.5 | 100 | 65 | 31.4 | 319.166 | 0.92 | 22.232 |
| 35 | 50.0 | 3.028 | 20.7 | 3.5 | 100 | 65 | 29.3 | 310.428 | 1.04 | 15.894 |
| 36 | 50.0 | 3.047 | 19.6 | 3.5 | 100 | 65 | 30.4 | 312.812 | 1.10 | 15.892 |
| 37 | 48.0 | 3.081 | 16.6 | 3.5 | 100 | 65 | 31.4 | 319.166 | 0.91 | 21.437 |
| 38 | 48.0 | 2.019 | 17.3 | 3.5 | 100 | 65 | 30.7 | 317.578 | 0.90 | 25.416 |
| 39 | 48.0 | 2.040 | 17.0 | 3.5 | 100 | 65 | 31.0 | 318.372 | 0.87 | 24.618 |

TABLE 12

| | n-type semiconductor layer | | Well layer | | First barrier layer | Second barrier layer | | | | |
| | Al composition ratio q | Film thick-ness | Al composition ratio s | Film thick-ness | Al composition ratio | Al composition ratio | Composition difference q-s | Emission wavelength | Light output | FWHM |
| Sample | [%] | [nm] | [%] | [nm] | [%] | [%] | [%] | [nm] | [a.u.] | [nm] |
|---|---|---|---|---|---|---|---|---|---|---|
| 40 | 55.0 | 3.035 | 27.6 | 3.5 | 100 | 65 | 27.4 | 296.110 | 0.60 | 14.329 |
| 41 | 55.0 | 3.020 | 22.6 | 3.5 | 100 | 65 | 32.4 | 306.454 | 0.86 | 18.288 |
| 42 | 55.0 | 3.035 | 20.7 | 3.5 | 100 | 65 | 34.3 | 310.428 | 0.97 | 17.485 |
| 43 | 55.0 | 3.020 | 20.4 | 3.5 | 100 | 65 | 34.6 | 311.223 | 1.00 | 16.688 |
| 44 | 55.0 | 3.066 | 19.6 | 3.5 | 100 | 65 | 35.4 | 312.812 | 1.07 | 17.480 |
| 45 | 55.0 | 3.031 | 19.6 | 3.5 | 100 | 65 | 35.4 | 312.812 | 0.93 | 15.890 |
| 46 | 55.0 | 3.080 | 19.2 | 3.5 | 100 | 65 | 35.8 | 313.607 | 0.92 | 18.274 |
| 47 | 55.0 | 3.075 | 18.8 | 3.5 | 100 | 65 | 36.2 | 314.401 | 1.08 | 15.886 |
| 48 | 55.0 | 3.066 | 18.5 | 3.5 | 100 | 65 | 36.5 | 315.196 | 0.96 | 18.268 |
| 49 | 55.0 | 3.033 | 18.1 | 3.5 | 100 | 65 | 36.9 | 315.990 | 1.03 | 17.472 |
| 50 | 55.0 | 3.101 | 17.7 | 3.5 | 100 | 65 | 37.3 | 316.784 | 1.10 | 17.472 |
| 51 | 55.0 | 3.087 | 17.3 | 3.5 | 100 | 65 | 37.7 | 317.578 | 1.08 | 16.675 |
| 52 | 55.0 | 3.080 | 17.3 | 3.5 | 100 | 65 | 37.7 | 317.578 | 0.90 | 18.263 |
| 53 | 55.0 | 2.770 | 13.2 | 3.5 | 100 | 65 | 41.8 | 326.309 | 0.12 | 35.681 |

TABLE 13

| | n-type semiconductor layer | | Well layer | | Barrier layer | | | | |
| | Al composition ratio q | Film thickness | Al composition ratio s | Film thick-ness | Al composition ratio | Composition difference q-s | Emission wavelength | Light output | FWHM |
| Sample | [%] | [um] | [%] | [nm] | [%] | [%] | [nm] | [a.u.] | [nm] |
|---|---|---|---|---|---|---|---|---|---|
| 54 | 55.0 | 3.062 | 17.3 | 3.5 | 65 | 37.7 | 317.578 | 0.82 | 19.058 |

TABLE 14

| | n-type semiconductor layer | | Uppermost well layer | | Barrier layer | | | | |
| | Al composition ratio q | Film thickness | Al composition ratio s | Film thick-ness | Al composition ratio | Composition difference q-s | Emission wavelength | Light output | FWHM |
| Sample | [%] | [um] | [%] | [nm] | [%] | [%] | [nm] | [a.u.] | [nm] |
|---|---|---|---|---|---|---|---|---|---|
| 55 | 35.0 | 3.223 | 25.7 | 2 | 65 | 9.3 | 300.090 | 0.46 | 14.323 |
| 56 | 48.0 | 2.920 | 28.3 | 2 | 65 | 19.7 | 294.518 | 0.31 | 17.517 |
| 57 | 35.0 | 2.670 | 23.4 | 2 | 65 | 11.6 | 304.863 | 0.32 | 20.672 |
| 58 | 35.0 | 2.600 | 6.0 | 2 | 60 | 29.0 | 341.367 | 0.10 | 32.482 |
| 59 | 50.0 | 2.125 | 32.1 | 2 | 65 | 17.9 | 286.551 | 0.18 | 24.705 |
| 60 | 50.0 | 2.123 | 29.1 | 2 | 65 | 20.9 | 292.925 | 0.06 | 13.539 |
| 61 | 48.0 | 2.168 | 22.6 | 2 | 65 | 25.4 | 306.454 | 0.20 | 19.082 |
| 62 | 50.0 | 2.340 | 21.5 | 2 | 65 | 28.5 | 308.839 | 0.49 | 22.256 |
| 63 | 50.0 | 2.185 | 20.7 | 2 | 65 | 29.3 | 310.428 | 0.11 | 20.661 |
| 64 | 50.0 | 2.056 | 20.4 | 2 | 65 | 29.6 | 311.223 | 0.52 | 21.456 |
| 65 | 50.0 | 2.060 | 19.6 | 2 | 65 | 30.4 | 312.812 | 0.38 | 22.249 |
| 66 | 50.0 | 2.179 | 19.6 | 2 | 65 | 30.4 | 312.812 | 0.52 | 23.045 |
| 67 | 50.0 | 2.084 | 18.1 | 2 | 65 | 31.9 | 315.990 | 0.34 | 23.827 |
| 68 | 50.0 | 2.092 | 17.3 | 2 | 65 | 32.7 | 317.578 | 0.33 | 25.409 |
| 69 | 50.0 | 2.070 | 15.1 | 2 | 65 | 34.9 | 322.342 | 0.21 | 29.360 |
| 70 | 50.0 | 2.320 | 14.3 | 2 | 65 | 35.7 | 323.929 | 0.22 | 26.179 |
| 71 | 50.0 | 2.085 | 13.5 | 2 | 65 | 36.5 | 325.516 | 0.22 | 29.349 |
| 72 | 35.0 | 2.040 | 17.7 | 2 | 60 | 17.3 | 316.784 | 0.11 | 24.616 |

TABLE 15

| Sample | n-type semiconductor layer | | Uppermost well layer | | Barrier layer | Composition difference q-s [%] | Emission wavelength [nm] | Light output [a.u.] | FWHM [nm] |
|---|---|---|---|---|---|---|---|---|---|
| | Al composition ratio q [%] | Film thickness [um] | Al composition ratio s [%] | Film thickness [nm] | Al composition ratio [%] | | | | |
| 73 | 65.0 | 2.266 | 45.8 | 2 | 85 | 19.2 | 257.808 | 0.51 | 11.996 |
| 74 | 65.0 | 2.283 | 44.7 | 2 | 85 | 20.3 | 260.207 | 0.50 | 13.591 |
| 75 | 65.0 | 2.270 | 44.3 | 2 | 85 | 20.7 | 261.006 | 0.57 | 11.193 |
| 76 | 65.0 | 2.093 | 43.5 | 2 | 85 | 21.5 | 262.605 | 0.51 | 13.588 |
| 77 | 65.0 | 2.228 | 43.5 | 2 | 85 | 21.5 | 262.605 | 0.54 | 13.587 |
| 78 | 65.0 | 2.185 | 43.2 | 2 | 85 | 21.8 | 263.404 | 0.54 | 12.788 |
| 79 | 65.0 | 2.144 | 42.8 | 2 | 85 | 22.2 | 264.204 | 0.49 | 13.585 |
| 80 | 65.0 | 2.237 | 40.9 | 2 | 85 | 24.1 | 268.199 | 0.66 | 15.177 |
| 81 | 65.0 | 2.240 | 40.9 | 2 | 85 | 24.1 | 268.199 | 0.70 | 15.175 |
| 82 | 65.0 | 2.258 | 40.5 | 2 | 85 | 24.5 | 268.997 | 0.67 | 15.175 |
| 83 | 65.0 | 2.260 | 40.1 | 2 | 85 | 24.9 | 269.796 | 0.85 | 20.765 |
| 84 | 70.0 | 2.840 | 39.3 | 3 | 85 | 30.7 | 271.393 | 0.92 | 15.170 |
| 85 | 55.0 | 2.060 | 39.3 | 3 | 85 | 15.7 | 271.393 | 0.98 | 14.371 |
| 86 | 55.0 | 2.036 | 39.0 | 3 | 85 | 16.0 | 272.192 | 0.90 | 14.370 |
| 87 | 55.0 | 2.061 | 39.0 | 3 | 85 | 16.0 | 272.192 | 1.00 | 16.766 |
| 88 | 55.0 | 2.057 | 38.6 | 3 | 85 | 16.4 | 272.990 | 1.02 | 14.369 |
| 89 | 55.0 | 2.070 | 38.2 | 3 | 85 | 16.8 | 273.788 | 0.98 | 15.166 |
| 90 | 55.0 | 1.950 | 37.4 | 3 | 85 | 17.6 | 275.385 | 1.00 | 15.163 |
| 91 | 55.0 | 2.045 | 37.1 | 3 | 85 | 17.9 | 276.183 | 0.95 | 15.161 |
| 92 | 55.0 | 1.920 | 35.9 | 3 | 75 | 19.1 | 278.577 | 0.97 | 16.753 |
| 93 | 55.0 | 2.075 | 35.5 | 3 | 85 | 19.5 | 279.374 | 1.00 | 15.953 |
| 94 | 55.0 | 2.078 | 35.2 | 3 | 85 | 19.8 | 280.172 | 1.09 | 14.355 |
| 95 | 55.0 | 1.850 | 34.8 | 3 | 85 | 20.2 | 280.970 | 1.21 | 15.951 |
| 96 | 55.0 | 2.079 | 34.4 | 3 | 85 | 20.6 | 281.767 | 1.37 | 16.747 |
| 97 | 55.0 | 2.053 | 34.0 | 3 | 85 | 21.0 | 282.565 | 1.36 | 15.948 |
| 98 | 55.0 | 2.086 | 33.6 | 3 | 85 | 21.4 | 283.362 | 1.23 | 16.744 |
| 99 | 55.0 | 2.067 | 32.5 | 3 | 85 | 22.5 | 285.754 | 1.22 | 15.942 |
| 100 | 55.0 | 2.091 | 32.1 | 3 | 85 | 22.9 | 286.551 | 1.12 | 18.329 |
| 101 | 55.0 | 2.049 | 32.1 | 3 | 85 | 22.9 | 286.551 | 1.26 | 16.737 |

TABLE 16

| Sample | n-type semiconductor layer | | Uppermost well layer | | Barrier layer | Composition difference q-s [%] | Emission wavelength [nm] | Light output [a.u.] | FWHM [nm] |
|---|---|---|---|---|---|---|---|---|---|
| | Al composition ratio q [%] | Film thickness [um] | Al composition ratio s [%] | Film thickness [nm] | Al composition ratio [%] | | | | |
| 102 | 55.0 | 2.062 | 31.7 | 3 | 85 | 23.3 | 287.348 | 1.30 | 16.736 |
| 103 | 55.0 | 1.690 | 31.4 | 3 | 85 | 23.6 | 288.145 | 1.15 | 15.139 |
| 104 | 55.0 | 2.038 | 31.0 | 3 | 85 | 24.0 | 288.942 | 1.15 | 17.530 |
| 105 | 55.0 | 2.130 | 30.6 | 3 | 85 | 24.4 | 289.739 | 1.10 | 16.729 |
| 106 | 55.0 | 2.096 | 30.2 | 3 | 85 | 24.8 | 290.535 | 1.22 | 16.728 |
| 107 | 55.0 | 2.091 | 29.8 | 3 | 85 | 25.2 | 291.332 | 0.92 | 17.522 |
| 108 | 55.0 | 1.720 | 29.1 | 3 | 85 | 25.9 | 292.925 | 1.08 | 17.522 |
| 109 | 55.0 | 2.161 | 28.7 | 3 | 85 | 26.3 | 293.721 | 1.02 | 17.517 |
| 110 | 55.0 | 1.920 | 28.7 | 3 | 85 | 26.3 | 293.721 | 1.15 | 17.520 |
| 111 | 55.0 | 2.161 | 27.9 | 3 | 85 | 27.1 | 295.314 | 0.92 | 16.718 |
| 112 | 55.0 | 2.079 | 27.6 | 3 | 85 | 27.4 | 296.110 | 1.07 | 16.718 |
| 113 | 55.0 | 1.870 | 27.2 | 2 | 75 | 27.8 | 296.906 | 0.67 | 15.919 |
| 114 | 55.0 | 1.850 | 27.9 | 3 | 85 | 27.1 | 295.314 | 0.76 | 17.513 |
| 115 | 55.0 | 1.850 | 26.8 | 3 | 85 | 28.2 | 297.702 | 0.80 | 16.714 |
| 116 | 55.0 | 2.058 | 25.7 | 3 | 85 | 29.3 | 300.090 | 0.19 | 21.486 |
| 117 | 55.0 | 1.840 | 25.3 | 2 | 75 | 29.7 | 300.886 | 0.39 | 17.502 |
| 118 | 55.0 | 1.994 | 21.1 | 2 | 75 | 33.9 | 309.634 | 0.30 | 21.462 |
| 119 | 55.0 | 2.026 | 23.0 | 2 | 75 | 32.0 | 305.658 | 0.58 | 19.084 |
| 120 | 50.0 | 1.850 | 18.5 | 2 | 65 | 31.5 | 315.196 | 0.49 | 23.032 |
| 121 | 50.0 | 1.880 | 17.0 | 2 | 65 | 33.0 | 318.372 | 0.32 | 25.403 |
| 122 | 55.0 | 2.090 | 15.4 | 2 | 75 | 39.6 | 321.548 | 0.12 | 23.015 |
| 123 | 50.0 | 1.880 | 15.4 | 2 | 65 | 34.6 | 321.548 | 0.36 | 26.981 |
| 124 | 55.0 | 1.880 | 14.3 | 2 | 65 | 40.7 | 323.929 | 0.28 | 27.768 |
| 125 | 50.0 | 1.880 | 13.9 | 2 | 65 | 36.1 | 324.722 | 0.21 | 31.728 |
| 126 | 50.0 | 1.850 | 13.2 | 2 | 65 | 36.8 | 326.309 | 0.34 | 28.550 |
| 127 | 35.0 | 1.860 | 6.0 | 2 | 60 | 29.0 | 341.367 | 0.05 | 27.718 |

TABLE 16-continued

| Sample | n-type semiconductor layer Al composition ratio q [%] | Film thickness [um] | Uppermost well layer Al composition ratio s [%] | Film thick-ness [nm] | Barrier layer Al composition ratio [%] | Composition difference q-s [%] | Emission wavelength [nm] | Light output [a.u.] | FWHM [nm] |
|---|---|---|---|---|---|---|---|---|---|
| 128 | 35.0 | 1.990 | 8.6 | 2 | 60 | 26.4 | 335.822 | 0.13 | 48.276 |
| 129 | 35.0 | 1.920 | 6.0 | 2 | 60 | 29.0 | 341.367 | 0.59 | 45.059 |

TABLE 17

| Sample | n-type semiconductor layer Al composition ratio q [%] | Film thickness [um] | Uppermost well layer Al composition ratio s [%] | Film thick-ness [nm] | Barrier layer Al composition ratio [%] | Composition difference q-s [%] | Emission wavelength [nm] | Light output [a.u.] | FWHM [nm] |
|---|---|---|---|---|---|---|---|---|---|
| 130 | 55.0 | 2.140 | 31.8 | 3 | 85 | 23.2 | 287.300 | 0.17 | 19.671 |

TABLE 18

| Sample | n-type semiconductor layer Al composition ratio q [%] | Film thickness [um] | Uppermost well layer Al composition ratio s [%] | Film thick-ness [nm] | Barrier layer Al composition ratio [%] | Composition difference q-s [%] | Emission wavelength [nm] | Light output [a.u.] | FWHM [nm] |
|---|---|---|---|---|---|---|---|---|---|
| 131 | 55.0 | 2.127 | 36.7 | 3 | 85 | 18.3 | 277.000 | 0.71 | 13.564 |

Effects of the First Embodiment

The effects of the first embodiment will be examined based on the results in Experiment Example.

The first embodiment is a light-emitting element which emits ultraviolet light at a center wavelength of more than 320 nm and not more than 365 nm and is configured such that the growth mode of the n-type semiconductor layer is lattice relaxation, the active layer has a single quantum well structure and the composition difference q-s obtained by subtracting the Al composition ratio of the well layer from the Al composition ratio of the n-type semiconductor satisfies not less than 22%.

In FIGS. 4 and 5, among the samples plotted as black filled squares, the samples, which are configured such that the emission wavelength is more than 320 nm and not more than 365 nm and the composition difference q-s obtained by subtracting the Al composition ratio s of the well layer from the Al composition ratio q of the n-type semiconductor satisfies not less than 22%, are light-emitting elements that satisfy the configuration of the first embodiment. As shown in FIGS. 4 and 5, the samples plotted as black filled squares and having emission wavelengths of more than 320 nm and not more than 365 nm (i.e., the samples that satisfy part of the configuration of the first embodiment) have high light output and a narrow full width at half maximum.

Figure 6:
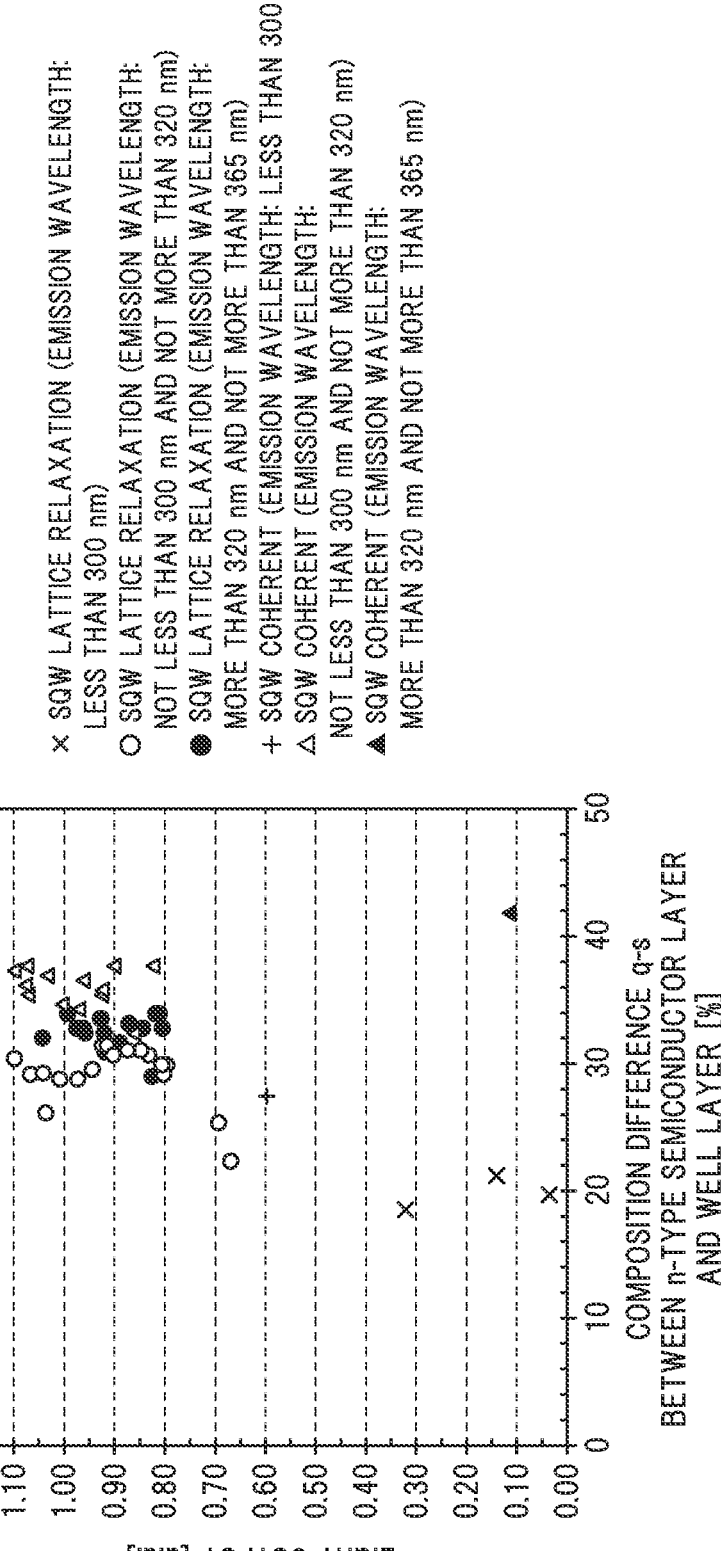
FIG. 6 is a graph showing a relationship between composition difference q-s and light output when an active layer has a single quantum well structure in Experiment Example.
Figure 7:
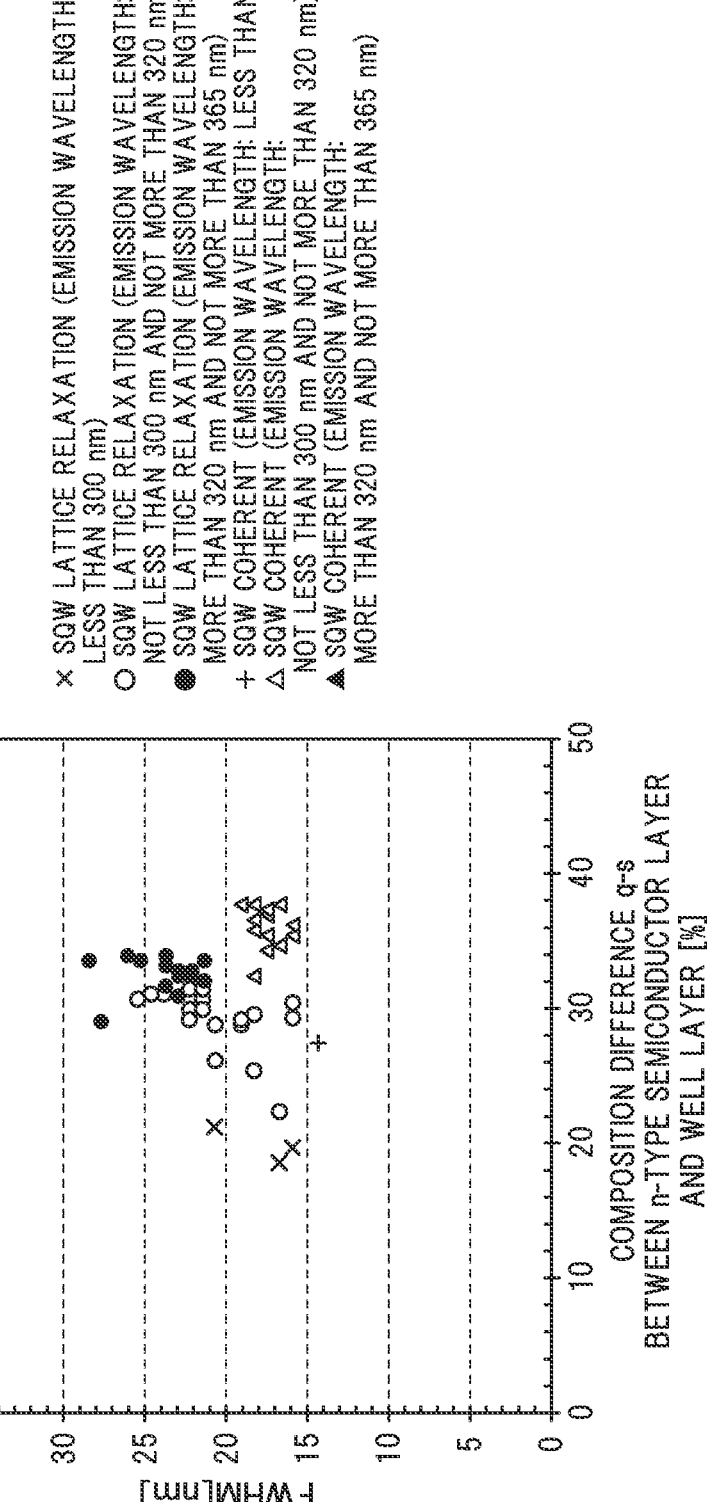
FIG. 7 is a graph showing a relationship between composition difference q-s and full width at half maximum when the active layer has a single quantum well structure in Experiment Example.

Next, referring to FIGS. 6 to 9, the results shown in FIGS. 4 and 5 are viewed from a different perspective. FIG. 6 is a diagram illustrating a relationship between light output and composition difference q-s between the n-type semiconduc- tor layer and the well layer for the samples in which the active layer has a single quantum well structure. FIG. 7 is a diagram illustrating a relationship between full width at half maximum and composition difference q-s between the n-type semiconductor layer and the well layer for the samples in which the active layer has a single quantum well structure. FIG. 8 is a diagram illustrating a relationship between Al composition ratio of the well layer and light output for the samples in which the active layer has a single quantum well structure. FIG. 9 is a diagram illustrating a relationship between Al composition ratio of the well layer and full width at half maximum for the samples in which the active layer has a single quantum well structure. In FIGS. 6 to 9, results for the samples, which are configured such that the growth mode of the n-type semiconductor layer is lattice relaxation and the emission wavelength is less than 300 nm, are plotted as X cross symbols, results for the samples, which are configured such that the growth mode of the n-type semiconductor layer is lattice relaxation and the emission wavelength is not less than 300 nm and not more than 320 nm, are plotted as open circles, and results for the samples, which are configured such that the growth mode of the n-type semiconductor layer is lattice relaxation and the emission wavelength is more than 320 nm and not more than 365 nm, are plotted as black filled circles. In addition, in FIGS. 6 to 9, results for the samples, which are configured such that the growth mode of the n-type semiconductor layer is coherent and the emission wavelength is less than 300 nm, are plotted as +cross symbols, results for the samples, which are configured such that the growth mode of the n-type semiconductor layer is coherent and the emission wave- length is not less than 300 nm and not more than 320 nm, are plotted as open triangles, and results for the samples, which are configured such that the growth mode of the n-type semiconductor layer is coherent and the emission wavelength is more than 320 nm and not more than 365 nm, are plotted as black filled triangles.

In FIGS. 6 and 7, among the samples plotted as black filled circles, the samples, which are configured such that the composition difference q-s satisfies not less than 22%, are light-emitting elements that satisfy the configuration of the first embodiment.

The samples plotted as black filled circles in FIG. 6 show that particularly high light output is obtained when the composition difference q-s is not less than 22%. This shows that high light output can be obtained by satisfying the configuration of the first embodiment. Furthermore, among such samples, particularly high light output is obtained when the composition difference q-s is not less than 28%.

In addition, the samples plotted as black filled circles in FIGS. 8 and 9 show that the light output is improved and the full width at half maximum is narrowed by setting the composition ratio of the well layer to not more than 10%. From this point of view, the composition ratio of the well layer in the samples plotted as black filled circles is preferably less than 6%.

Effects of the Second Embodiment

Next, the effects of the second embodiment will be examined. The second embodiment is a light-emitting element which emits ultraviolet light at a center wavelength of not less than 300 nm and not more than 320 nm and is configured such that the active layer has a single quantum well structure including the first barrier layer and the second barrier layer.

In FIGS. 4 and 5, among the samples plotted as black filled squares and open squares, the samples, which are configured such that the emission wavelength is not less than 300 nm and not more than 320 nm and the active layer includes the first barrier layer and the second barrier layer, are light-emitting elements that satisfy the configuration of the second embodiment. FIGS. 4 and 5 show that the samples plotted as black filled squares and open squares and having emission wavelengths of not less than 300 nm and not more than 320 nm (i.e., the samples that satisfy part of the configuration of the second embodiment) have high light output and a narrow full width at half maximum. That is, in case that the active layer has a single quantum well structure, high light output and a narrow full width at half maximum are obtained when the emission wavelength is not less than 300 nm and not more than 320 nm regardless of whether the growth mode of the n-type semiconductor layer is lattice relaxation or coherent growth.

Figure 10:
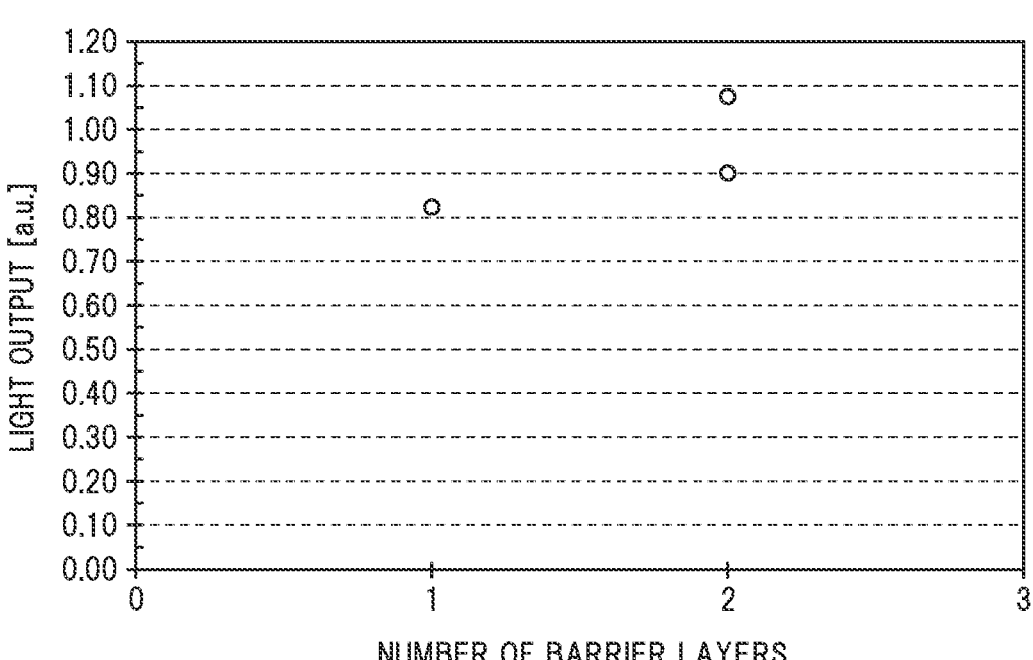
FIG. 10 is a graph showing a relationship between number of barrier layers and light output when the active layer has a single quantum well structure in Experiment Example.
Figure 11:
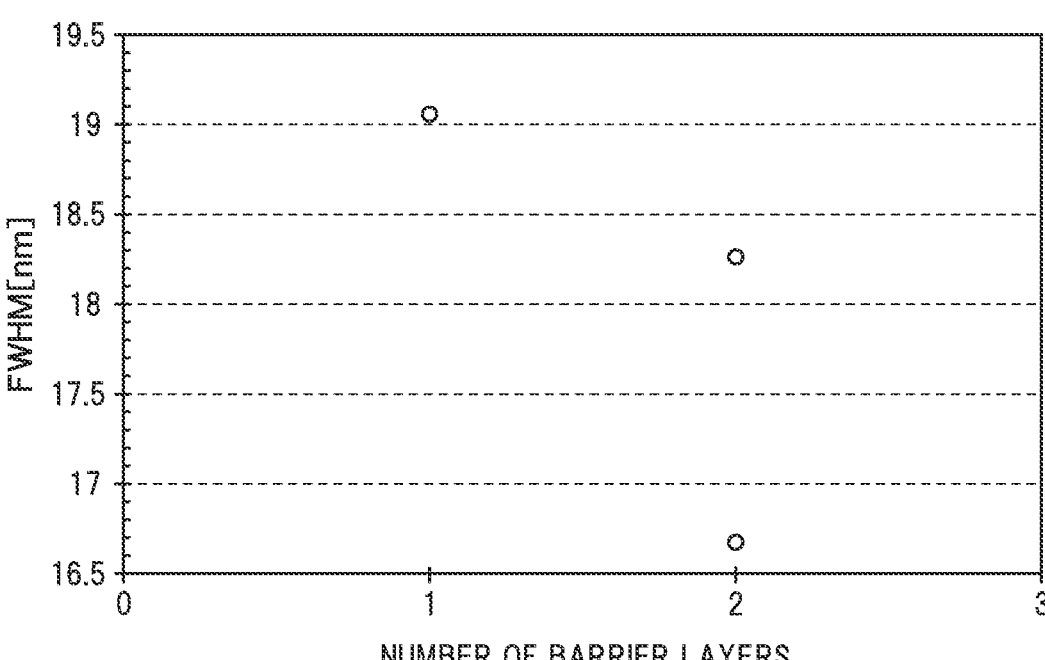
FIG. 11 is a graph showing a relationship between number of barrier layers and full width at half maximum when the active layer has a single quantum well structure in Experiment Example.

FIGS. 10 and 11 are diagrams in which comparisons of the light output and the full width at half maximum are made between three samples: two of Samples 44 to 53 listed in Table 4 and Sample 54 in Table 5. These three samples have same configuration as each other, except for the number of barrier layers. These three samples have an emission wavelength of not less than 300 nm and not more than 320 nm and are configured such that the n-type semiconductor layer is formed by coherent growth. Of these three, the samples having two barrier layers satisfy the configuration of the second embodiment. FIGS. 10 and 11 show that the samples having two barrier layers have higher light output and narrower full width at half maximum than the sample having one barrier layer. This shows that even higher light output and an even narrower full width at half maximum can be obtained by satisfying the configuration of the second embodiment.

In addition, in FIGS. 6 to 9, among the samples plotted as open circles and open triangles, the samples in which the active layer includes the first barrier layer and the second barrier layer are light-emitting elements that satisfy the configuration of the second embodiment.

The samples plotted as open circles and open triangles in FIG. 6 show that particularly high light output is obtained when the composition difference q-s is not less than 28% and not more than 41%. In addition, among the samples plotted as open circles and open triangles in FIG. 7, the sampled plotted as open triangles show that a narrow full width at half maximum is obtained particularly when the composition difference q-s is not less than 30% and not more than 40%.

In addition, the samples plotted as open circles and open triangles in FIG. 8 show that the light output is improved by setting the Al composition ratio of the well layer to not less than 15% and not more than 26%. In addition, the samples plotted as open circles and open triangles in FIG. 9 show that the full width at half maximum is narrowed by setting the Al composition ratio of the well layer to not less than 18%.

Effects of the Third Embodiment

Next, the effects of the third will be examined.

The third embodiment is a light-emitting element which emits ultraviolet light at a center wavelength of not less than 265 nm and less than 300 nm and is configured such that the growth mode of the n-type semiconductor layer is coherent growth and the active layer has a multi quantum well structure.

In FIGS. 4 and 5, among the samples plotted as open diamonds, the samples which are configured such that the emission wavelength is not less than 265 nm and less than 300 nm are light-emitting elements that satisfy the configuration of the third embodiment. FIGS. 4 and 5 show that the samples plotted as open diamonds and having emission wavelengths of not less than 265 nm and less than 300 nm (i.e., the samples that satisfy part of the configuration of the third embodiment) tend to have high light output and a narrow full width at half maximum. Of those, the samples with emission wavelengths of not less than 285 nm tend to have particularly high light output.

Figure 12:
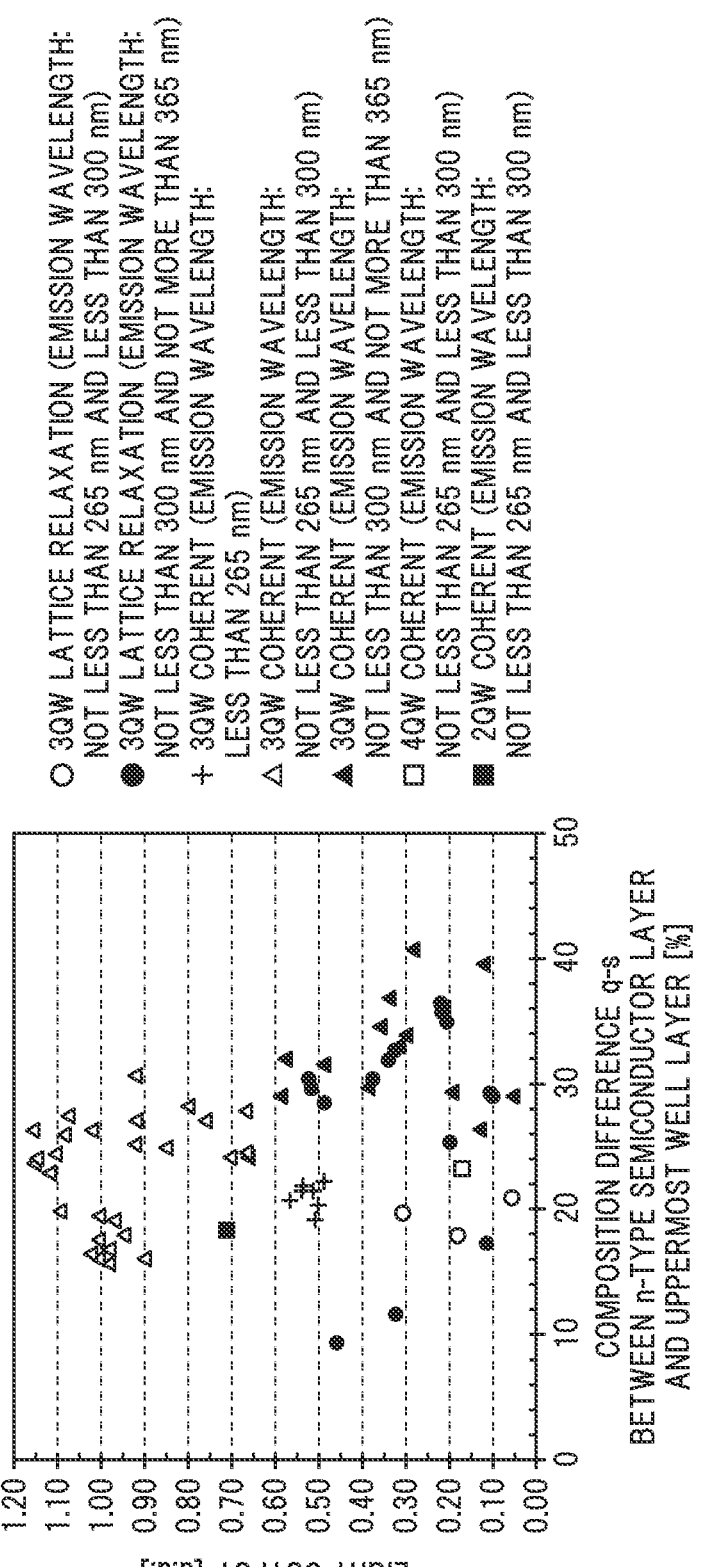
FIG. 12 is a graph showing a relationship between composition difference q-s and light output when the active layer has a multi quantum well structure in Experiment Example.

Next, referring to FIGS. 12 to 15, the results shown in FIGS. 4 and 5 are viewed from a different perspective. FIG. 12 is a diagram illustrating a relationship between light output and composition difference q-s between the n-type semiconductor layer and the uppermost well layer for the samples in which the active layer has a multi quantum well structure. FIG. 13 is a diagram illustrating a relationship between full width at half maximum and composition difference q-s between the n-type semiconductor layer and the uppermost well layer for the samples in which the active layer has a multi quantum well structure. FIG. 14 is a diagram illustrating a relationship between Al composition ratio of the uppermost well layer and light output for the samples in which the active layer has a multi quantum well structure. FIG. 15 is a diagram illustrating a relationship between Al composition ratio of the uppermost well layer and full width at half maximum for the samples in which the active layer has a multi quantum well structure. In FIGS. 12 to 15, results for the samples, which are configured such that the active layer has three well layers (i.e., 3QW), the growth mode of the n-type semiconductor layer is lattice relaxation and the emission wavelength is not less than 265 nm and less than 300 nm, are plotted as open circles, and results for the samples, which are configured such that the active layer has three well layers, the growth mode of the n-type semiconductor layer is lattice relaxation and the emission wavelength is not less than 300 nm and not more than 365 nm, are plotted as black filled circles. In addition, in FIGS. 12 to 15, results for the samples, which are configured such that the active layer has three well layers, the growth mode of the n-type semiconductor layer is coherent growth and the emission wavelength is less than 265 nm, are plotted as +cross symbols, results for the samples, which are configured such that the active layer has three well layers, the growth mode of the n-type semiconductor layer is coherent growth and the emission wavelength is not less than 265 nm and less than 300 nm, are plotted as open triangles, and results for the samples, which are configured such that the active layer has three well layers, the growth mode of the n-type semiconductor layer is coherent growth and the emission wavelength is not less than 300 nm and not more than 365 nm, are plotted as black filled triangles. In addition, in FIGS. 12 to 15, a result for the sample, which is configured such that the active layer has four well layers (i.e., 4QW), the growth mode of the n-type semiconductor layer is coherent growth and the emission wavelength is not less than 265 nm and less than 300 nm, is plotted as an open square, and a result for the sample, which is configured such that the active layer has two well layers (i.e., 2QW), the growth mode of the n-type semiconductor layer is coherent growth and the emission wavelength is not less than 265 nm and less than 300 nm, is plotted as a black filled square.

In FIGS. 12 to 15, the samples plotted as open triangles, open square and black filled square are light-emitting elements that satisfy the configuration of the third embodiment.

The samples plotted as open triangles, open square and black filled square in FIG. 12 show that the composition difference q-s preferably satisfies not less than 15% and not more than 31%, more preferably satisfies not less than 20% and less than 30%, from the viewpoint of improving the light output. In addition, the samples plotted as open triangles, open square and black filled square in FIG. 13 show that the composition difference q-s preferably satisfies not more than 22% from the viewpoint of narrowing the full width at half maximum.

In addition, the samples plotted as open triangles, open square and black filled square in FIGS. 14 and 15 show that the light output is improved and the full width at half maximum is narrowed by setting the Al composition ratio of the uppermost well layer to not less than 28% and not more than 36%.

In addition, the examples in FIGS. 12 and 14 show that the light output of the light-emitting element with the active layer having four well layers is relatively low. Therefore, in the configuration of the third embodiment, the number of well layers is preferably two or three.

Figure 16:
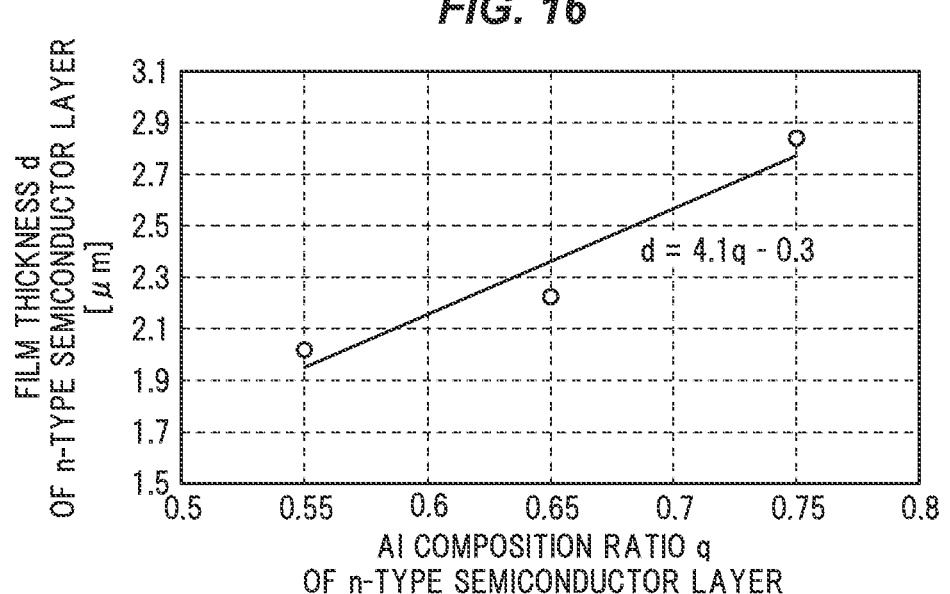
FIG. 16 is a graph showing a relationship between an Al composition ratio q of an n-type semiconductor layer and a film thickness d [μm] of the n-type semiconductor layer to obtain high light output when the active layer has a multi quantum well structure in Experiment Example.

FIG. 16 is a diagram showing the relationship between the Al composition ratio q of the n-type semiconductor layer and the film thickness d [μm] of the n-type semiconductor layer for the samples plotted as open triangles and black filled square in FIGS. 12 to 15. All of these are the samples having high light output, which means that FIG. 16 shows the relationship between the Al composition ratio q of the n-type semiconductor layer and the thickness d of the n-type semiconductor layer to have high light output. These are three types of samples which have the n-type semiconductor layers with the Al composition ratio q of 55%, 65%, and 75%. The vertical axis of the graph in FIG. 16 indicates the average film thickness of the n-type semiconductor layer for the samples with each Al composition ratio. In FIG. 16, an approximate straight line of three plotted points is also shown. This approximate straight line is a straight line expressed by d=4.1q−0.3. In other words, for the light-emitting elements which are configured such that the emission wavelength is not less than 265 nm and less than 300 nm, the active layer has a multi quantum well structure and the growth mode of the n-type semiconductor layer is coherent growth, the Al composition ratio q of the n-type semiconductor layer and the film thickness d of the n-type semiconductor layer preferably satisfy the relationship d=4.1q−0.3 or a relationship close to this. It is preferable to satisfy, e.g., 4.1q−0.6≤d≤4.1q, which is the range of d=4.1q−0.3±0.3.

SUMMARY OF THE EMBODIMENTS

Technical ideas understood from the embodiments will be described below citing the reference signs, etc., used for the embodiments. However, each reference sign, etc., described below is not intended to limit the constituent elements in the claims to the members, etc., specifically described in the embodiments.

The first feature of the invention is a nitride semiconductor light-emitting element 1 that emits ultraviolet light at a central wavelength of more than 320 nm and not more than 365 nm and includes: a substrate 2 having a c-plane as a growth surface 21; and a nitride semiconductor layer 3 stacked on the growth surface 21 of the substrate 2, wherein the nitride semiconductor layer 3 includes an n-type semiconductor layer 32 including Al, Ga and N, an active layer 33 being formed on the n-type semiconductor layer 32 on the opposite side to the substrate 2 and having a single quantum well structure with one well layer 332 including Al, Ga and N, and a p-type semiconductor layer 35 formed on the active layer 33 on the opposite side to the substrate 2, wherein the n-type semiconductor layer 32 has an Al composition ratio of not more than 50% and a film thickness of more than 2 μm, and wherein a composition difference obtained by subtracting an Al composition ratio of the well layer 332 from the Al composition ratio of the n-type semiconductor layer 32 is not less than 22%.

It is thereby possible to provide a nitride semiconductor light-emitting element 1 that can achieve improved light output in a specific range of emission wavelength.

The second feature of the invention is that, in the first feature, the composition difference is not less than 28% and not more than 34%.

The light output and productivity of the nitride semiconductor light-emitting element 1 are thereby improved.

The third feature of the invention is that, in the first or second feature, the substrate 2 is a sapphire substrate, wherein the nitride semiconductor layer 3 further includes a buffer layer 31 that is formed between the substrate 2 and the n-type semiconductor layer 32 and has a layer including AN, and wherein a film thickness of the buffer layer 31 is not less than 1 μm and not more than 4 μm The light output of the nitride semiconductor light-emitting element 1 is thereby further improved.

The fourth feature of the invention is a nitride semiconductor light-emitting element 1 that emits ultraviolet light at a central wavelength of not less than 300 nm and not more than 320 nm and includes: a substrate 2 having a c-plane as a growth surface 21; and a nitride semiconductor layer 3 stacked on the growth surface 21 of the substrate 2, wherein the nitride semiconductor layer 3 includes an n-type semiconductor layer 32 including Al, Ga and N, an active layer 33 being formed on the n-type semiconductor layer 32 on the opposite side to the substrate 2 and having a single quantum well structure with one well layer 332 including Al, Ga and N, and a p-type semiconductor layer 35 formed on the active layer 33 on the opposite side to the substrate 2, and wherein the active layer 33 includes a first barrier layer 331a, a second barrier layer 331b and the well layer 332 in this order from the n-type semiconductor layer 32 side, the first barrier layer 331a including Al and N, and the second barrier layer 331b including Al, Ga, and N and having an Al composition ratio lower than that of the first barrier layer 331a.

It is thereby possible to provide a nitride semiconductor light-emitting element 1 that can achieve improved light output in a specific range of emission wavelength.

The fifth feature of the invention is that, in the fourth feature, a composition difference obtained by subtracting an Al composition ratio of the well layer 332 from an Al composition ratio of the n-type semiconductor layer 32 is not less than 28% and not more than 41%. The light output of the nitride semiconductor light-emitting element 1 is thereby further improved.

The sixth feature of the invention is that, in the fifth feature, the n-type semiconductor layer 32 satisfies at least one of an Al composition ratio of more than 50% and a film thickness of not more than 2 μm, and wherein the composition difference is not less than 30% and not more than 40%. It is thereby possible to narrow the full width at half maximum of the emission spectrum of the nitride semiconductor light-emitting element 1.

The seventh feature of the invention is that, in any one of the fourth to sixth features, a film thickness of the first barrier layer 331a is smaller than a film thickness of the second barrier layer 331b.

It is thereby possible to reduce the electrical resistance value of the entire nitride semiconductor light-emitting element 1.

The eighth feature of the invention is a nitride semiconductor light-emitting element 1 that emits ultraviolet light at a central wavelength of not less than 265 nm and less than 300 nm and includes: a substrate 2 having a c-plane as a growth surface 21; and a nitride semiconductor layer 3 stacked on the growth surface 21 of the substrate 2, wherein the nitride semiconductor layer 3 includes an n-type semiconductor layer 32 including Al, Ga and N, an active layer 33 being formed on the n-type semiconductor layer 32 on the opposite side to the substrate 2 and having a multi quantum well structure with a plurality of well layers 332a to 332c including Al, Ga and N, and a p-type semiconductor layer 35 formed on the active layer 33 on the opposite side to the substrate 2, and wherein an Al composition ratio of the n-type semiconductor layer 32 is more than 50% and not more than 70%.

It is thereby possible to provide a nitride semiconductor light-emitting element 1 that can achieve improved light output in a specific range of emission wavelength.

The ninth feature of the invention is that, in the eighth feature, an Al composition ratio q of the n-type semiconductor layer 32 and a film thickness d [μm] of the n-type semiconductor layer 32 satisfy a relationship $4.1q-0.6 \le d \le 4.1q$.

The light output of the nitride semiconductor light-emitting element 1 is thereby further improved.

The tenth feature of the invention is that, in the eighth or ninth feature, a composition difference obtained by subtracting an Al composition ratio of an uppermost well layer 332c, which is the well layer located closest to the p-type semiconductor layer 35 among the plurality of well layers 332a to 332c, from the Al composition ratio of the n-type semiconductor layer 32 is not less than 15% and not more than 31%.

The light output of the nitride semiconductor light-emitting element 1 is thereby further improved.

The eleventh feature of the invention is that, in any one of the eighth to tenth features, the substrate 2 is a sapphire substrate, wherein the nitride semiconductor layer 3 further includes a buffer layer 31 that is formed between the substrate 2 and the n-type semiconductor layer 32 and includes a layer including AlN, and wherein a film thickness of the buffer layer 31 is not less than 1 μm and not more than 4 μm. The light output of the nitride semiconductor light-emitting element 1 is thereby further improved.

Additional Note

Although the embodiments of the invention have been described, the invention according to claims is not to be limited to the embodiments described above. Further, please note that not all combinations of the features described in the embodiments are necessary to solve the problem of the invention. In addition, the invention can be appropriately modified and implemented without departing from the gist thereof.

The invention claimed is:

1. A nitride semiconductor light-emitting element that emits ultraviolet light at a central wavelength of not less than 300 nm and not more than 320 nm, the nitride semiconductor light-emitting element comprising:
   a substrate having a c-plane as a growth surface; and
   a nitride semiconductor layer stacked on the growth surface of the substrate,
   wherein the nitride semiconductor layer comprises an n-type semiconductor layer comprising Al, Ga and N, an active layer being formed on the n-type semiconductor layer on the opposite side to the substrate and comprising a single quantum well structure with one well layer comprising Al, Ga and N, and a p-type semiconductor layer formed on the active layer on the opposite side to the substrate, and
   wherein the active layer comprises a first barrier layer, a second barrier layer and the well layer in this order from the n-type semiconductor layer side, the first barrier layer comprising Al and N, and the second barrier layer comprising Al, Ga, and N and having an Al composition ratio lower than that of the first barrier layer.

2. The nitride semiconductor light-emitting element according to claim 1, wherein a composition difference obtained by subtracting an Al composition ratio of the well layer from an Al composition ratio of the n-type semiconductor layer is not less than 28% and not more than 41%.

3. The nitride semiconductor light-emitting element according to claim 2, wherein the n-type semiconductor layer satisfies at least one of an Al composition ratio of more than 50% and a film thickness of not more than 2 μm, and wherein the composition difference is not less than 30% and not more than 40%.

4. The nitride semiconductor light-emitting element according to claim 1, wherein a film thickness of the first barrier layer is smaller than a film thickness of the second barrier layer.

* * * * *